United States Patent
Udayakumar et al.

(10) Patent No.: US 7,019,352 B2
(45) Date of Patent: Mar. 28, 2006

(54) LOW SILICON-HYDROGEN SIN LAYER TO INHIBIT HYDROGEN RELATED DEGRADATION IN SEMICONDUCTOR DEVICES HAVING FERROELECTRIC COMPONENTS

(75) Inventors: K. R. Udayakumar, Dallas, TX (US); Martin G. Albrecht, McKinney, TX (US); Theodore S. Moise, Dallas, TX (US); Scott R. Summerfelt, Garland, TX (US); Sarah I. Hartwig, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 214 days.

(21) Appl. No.: 10/635,994

(22) Filed: Aug. 7, 2003

(65) Prior Publication Data

US 2005/0032301 A1   Feb. 10, 2005

(51) Int. Cl.
*H01L 27/01* (2006.01)

(52) U.S. Cl. .................. 257/310; 257/311; 257/532

(58) Field of Classification Search ............... 438/3, 438/240, 396, 792, 622, FOR 220, FOR 212; 257/310, 311, 532
See application file for complete search history.

(56) References Cited

U.S. PATENT DOCUMENTS

| | | | |
|---|---|---|---|
| 5,452,178 A | 9/1995 | Emesh et al. | |
| 5,825,068 A | 10/1998 | Yang | |
| 5,972,722 A | 10/1999 | Visokay et al. | |
| 6,090,697 A | 7/2000 | Xing et al. | |
| 6,107,657 A * | 8/2000 | Arita et al. | 257/295 |
| 6,144,060 A | 11/2000 | Park et al. | |
| 6,177,351 B1 | 1/2001 | Beratan et al. | |
| 6,225,656 B1 | 5/2001 | Cuchiaro et al. | |
| 6,242,299 B1 | 6/2001 | Hickert | |
| 6,249,014 B1 * | 6/2001 | Bailey | 257/295 |
| 6,261,967 B1 | 7/2001 | Athavale et al. | |
| 6,291,251 B1 | 9/2001 | Nam | |
| 6,423,592 B1 | 7/2002 | Sun | |
| 6,495,413 B1 | 12/2002 | Sun et al. | |
| 6,528,386 B1 | 3/2003 | Summerfelt et al. | |
| 6,534,809 B1 | 3/2003 | Moise et al. | |
| 6,576,482 B1 | 6/2003 | Aggarwal et al. | |
| 6,611,014 B1 | 8/2003 | Kanaya et al. | |
| 6,642,100 B1 | 11/2003 | Yang et al. | |

(Continued)

OTHER PUBLICATIONS

"FeRAM Tutorial", Ali Sheikholeslami and P. Glenn Gulak, A survey of circuit Innovations in Ferroelectric random-access memories, Proceedings of the IEEE, vol. 88, No. 3, May, 2000, 3 pages, taken from the Internet at: http://www.eecg.toronto.edu/-all/ferro/tutorial.html.

(Continued)

*Primary Examiner*—George Fourson
(74) *Attorney, Agent, or Firm*—Frederick J. Telecky, Jr.; W. James Brady III

(57) ABSTRACT

Semiconductor devices and fabrication methods are disclosed, in which one or more low silicon-hydrogen SiN barriers are provided to inhibit hydrogen diffusion into ferroelectric capacitors and into transistor gate dielectric interface areas. The barriers may be used as etch stop layers in various levels of the semiconductor device structure above and/or below the level at which the ferroelectric capacitors are formed so as to reduce the hydrogen related degradation of the switched polarization properties of the ferroelectric capacitors and to reduce negative bias temperature instability in the device transistors.

41 Claims, 10 Drawing Sheets

U.S. PATENT DOCUMENTS

| | | |
|---|---|---|
| 6,706,540 B1 | 3/2004 | Hikosaka et al. |
| 6,781,184 B1 | 8/2004 | Solayappan et al. |
| 2001/0034106 A1 | 10/2001 | Moise et al. |
| 2001/0044205 A1 | 11/2001 | Gilbert et al. |
| 2002/0011616 A1* | 1/2002 | Inoue et al. ............ 257/295 |
| 2002/0016012 A1* | 2/2002 | Kronke et al. ............ 438/3 |

OTHER PUBLICATIONS

"A survey of Circuit Innovations in Ferroelectric Random Access Memories", Ali Sheikholeslami and P. Glenn Gulak, Proceedings of the IEEE, vol. 88, No. 5, May, 2000, pp. 667-689.

"Generic CVD Reactor", CVD Basics, Daniel M. Dobkin, Dec. 7, 2001, 3 pages, taken from the Internet at: http://www.batnet.com/enigmatics/semiconductor_processing/CVD_Fundamentals/introdu . . . .

"Physical Vapor Deposition", Cougar Labs, Inc., Dec. 7, 2001, 9 pages, taken from the Internet at: http://www.cougarlabs.com/pvd1.html.

"Parasitic Channel Induced by Spin-On-Glass in a Double-Level Metallization Complimentary Metal Oxide Semiconductor Process", M. Murata, K. Yomauchi, H. Kojima, A. Yokoyama, T. Inoue and T. Iwamori, published in the Journal of Electrochemical Society, vol. 149, No. 8, 1993, pp. 2346-2356.

"Effects of Oxygen Content on Properties of Silicon Oxide Films Prepared at Room Temperature by Sputtering-Type Electron Cyclotron Resonance Plasma", Katsuhiko Furukawa, Yichun Liu, Hiroshi Nakashima, Dawei Gao, Yasuhiro Kashiwazaki, Kiichiro Uchino, Katsunori Muraoka and Hirohisa Tsuzuki, Journal of Applied Physics, vol. 84, No. 8, Oct. 15, 1998, pp. 4579-4584.

Notes taken at the International Symposium on Applications of Ferroelectrics Conference in Nara, Japan in May, 2002. The speaker was H. Nagel of Infineon Technologies and Toshiba Corporation, Key Technologies for High Density FeRAM Application, one page.

"The Hydrogen Content of Plasma-Deposited sillcon Nitride", W. A. Lanford and M. J. Rand, American Institute of Physics. J. Appl. Phys. 49(4), Apr., 1978, pp. 2473-2477.

"Free Energy Model for the Analysis of Bonding in a-$SI_xN_yH_z$ Alloys", Z. Yin and W. Smith, J. Vac. Sci. Technol. A, vol. 9, No. 3, MayJun., 1991, p. 972.

"Comparison Between HDP CVD and PECVD Silicon Nitride for Advanced Interconnect Applications", J. Yota, M. Janani, L.E. Camilletti, A. Kar-Roy, Q.Z. Liu, C. Nguyen, M.D. Woo J. Hander, and P. Van Cleemput, IEEE, 2000, pp. 76-78.

"Hydrogen Role on the Properties of Amorphous Silicon Nitride", F. De Brito Mots, J.F. Justo and A. Fazzio, Journal of Applied Physics, vol. 86, No. 4, Aug. 15, 1999, pp. 1843-1847.

* cited by examiner

LOW SILICON-HYDROGEN SIN LAYER TO INHIBIT HYDROGEN RELATED DEGRADATION IN SEMICONDUCTOR DEVICES HAVING FERROELECTRIC COMPONENTS

FIELD OF INVENTION

The present invention relates generally to semiconductor devices and more particularly to hydrogen barrier layers in semiconductor devices having ferroelectric components.

BACKGROUND OF THE INVENTION

Memory is used for storage of data, program code, and/or other information in many electronic products, such as personal computer systems, embedded processor-based systems, video image processing circuits, portable phones, and the like. Memory cells may be provided in the form of a dedicated memory integrated circuit (IC) or may be embedded (included) within a processor or other IC as on-chip memory. Ferroelectric memory, sometimes referred to as "FRAM" or "FERAM", is a non-volatile form of memory commonly organized in single-transistor, single-capacitor (1T/1C) or two-transistor, two-capacitor (2T/2C) configurations, in which each memory cell includes one or more access transistors. The non-volatility of an FERAM is due to the bi-stable characteristic of the ferroelectric material in the cell capacitor(s). The cells are typically organized in an array, such as folded-bitline, open-bitline, etc., wherein the individual cells are selected by plateline and wordline signals from address decoder circuitry, with the data being read from or written to the cells along bitlines using sense amp circuits.

FIG. 1 illustrates a 1T/1C FERAM cell 10 including a transistor 12 and a ferroelectric cell capacitor 14. A bottom electrode of the cell capacitor 14 is connected to a first source/drain terminal 15 of the transistor 12 and the other capacitor electrode is coupled to a plateline or driveline 20. Data is read from the cell 10 by applying a signal to the gate 16 of the transistor 12 along a corresponding wordline WL, thereby connecting the bottom electrode of the ferroelectric capacitor 14 to the other transistor source/drain at a bitline 18. A pulse signal is applied to the plateline 20, where the potential on the bitline 18 is the capacitor charge divided by the bitline capacitance. The capacitor charge is dependent upon the pre-existing bi-stable polarization state of the ferroelectric material in the capacitor 14, wherein the bitline potential can have two distinct values. A sense amplifier (not shown) is connected to the bitline 18 to detect the voltage associated with a logic value of either 1 or 0. Because such a read operation is destructive, the cell data is then rewritten back to the memory cell 10.

FIG. 2 illustrates a 2T/2C memory cell 30 in a memory array coupled to a complementary pair of bitlines 32 and 34, where the cell 30 comprises cell transistors 36 and 38 and ferroelectric cell capacitors 40 and 42. The first transistor 36 couples the bitline 32 with a first ferroelectric capacitor 40, and the second transistor 38 couples the complementary bitline 34 to a second ferroelectric capacitor 42. The first and second capacitors 40 and 42 have a common plateline 44 to which a signal is applied for polarizing the capacitors 40 and 42 during read and write operations. For a write operation, the transistors 36 and 38 are enabled via a wordline 46 to couple the capacitors 40 and 42 to the complementary logic levels on the bitlines 32 and 34 corresponding to a logic state to be stored in the cell 30. The plateline 44 is pulsed to polarize the capacitors 40, 42 to correspond to the desired logic state. In a read operation, the transistors 36 and 38 are enabled via the wordline 46 to couple the information stored in the ferroelectric capacitors 40 and 42 to the complementary bitline pair 32 and 34, and a pulse is applied to the plateline 44. This provides a differential signal across the bitline pair 32 and 34 that is sensed by a sense amplifier (not shown), wherein the sensed signal has a polarity corresponding to the data read from the cell 30.

Ferroelectric memory cells are often fabricated in stand-alone memory integrated circuits (ICs) and/or in logic circuits having on-board non-volatile memory (e.g., microprocessors, DSPs, communications chips, etc.). The ferroelectric memory arrays are typically constructed in a wafer along with CMOS logic circuits to create a semiconductor device, wherein the cell transistors are formed concurrently with logic transistors in the device, and the ferroelectric capacitors are constructed in a capacitor level above the wafer substrate. For example, the construction of the ferroelectric cell capacitors may be integrated into a CMOS fabrication process flow after transistor formation (e.g., after 'front-end' processing), and before the metalization or interconnection processing (e.g., before 'back-end' processing). However, many back-end processing steps include hydrogen, for example, in forming trench etch-stop layers, etch clean operations, copper sintering, and other process steps. This process hydrogen diffuses into the ferroelectric cell capacitors, causing degradation in the electric properties of the ferroelectric memory cells, including degraded switched polarization.

In addition to detrimental effects on the ferroelectric cell capacitors, hydrogen may also adversely degrade the performance of the memory cell transistors and logic transistors in the wafer. For example, hydrogen is known to generate fixed oxide charge and interface traps at the interface between the transistor gate dielectric and the underlying silicon, leading to negative bias temperature instability (NBTI). This results in reduced drain saturation current (Idsat) and an increase in the transistor threshold voltage (Vsat). Consequently, there is a need for hydrogen barriers and fabrication techniques for protecting ferroelectric capacitors and transistors from hydrogen in back-end and other fabrication processing.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope of the invention. Rather, the primary purpose of the summary is to present one or more concepts of the invention in a simplified form as a prelude to the more detailed description that is presented later. The invention relates to semiconductor devices and fabrication methods therefor, in which low silicon-hydrogen SiN barriers are provided to reduce or prevent the diffusion of hydrogen into ferroelectric capacitors and into transistor gate dielectric interface areas. The barriers may be used, for example, as etch stop layers in various levels of the semiconductor device structure above and/or below the level at which the ferroelectric capacitors are formed so as to reduce the hydrogen related degradation of the switched polarization properties of the ferroelectric capacitors and to reduce negative bias temperature instability in the device transistors.

One aspect of the invention provides semiconductor devices and methods for fabricating semiconductor devices, in which a ferroelectric capacitor is formed in a capacitor level above a semiconductor body, and a low silicon-hydrogen SiN layer is formed above the ferroelectric capacitor. The low silicon-hydrogen SiN layer has a low Fourier-Transform Infrared (FTIR) figure of merit value, for example, about 0.05 or less, calculated as a ratio of the FTIR spectra areas for Si—H and N—H with appropriate scaling (Si—H absorbance/(N—H absorbance×1.4)). The low figure of merit indicates the relatively low amount of Si—H bonds within the SiN material compared to the amount of N—H bonds, wherein the nitrogen bonded hydrogen is less likely to dissociate and cause degradation of the ferroelectric capacitors and or transistors in the semiconductor device. The low silicon-hydrogen SiN layer, moreover, may be deposited using a plasma enhanced chemical vapor deposition (PECVD) process employing high nitrogen and low ammonia flows to provide a highly conformal deposition thickness. The conformal deposition thickness facilitates operation of the SiN layer as an effective hydrogen barrier to protect ferroelectric material and transistor gate interfaces, particularly along the sidewalls of a vertical ferroelectric capacitor stack and transistor structures.

The low silicon-hydrogen SiN layer may be formed anywhere above the ferroelectric capacitors, for example, where the low silicon-hydrogen SiN operates as an etch stop layer in the capacitor level, an etch stop layer in one or more metalization levels formed above the capacitor level, an etch stop layer in a protective oxide level above an uppermost metalization level, etc. The device may comprise a second low silicon-hydrogen SiN layer below the capacitor level and above a transistor, where the second low silicon-hydrogen SiN layer also has a low FTIR figure of merit calculated as Si—H absorbance/(N—H absorbance ×1.4). For example, the second low silicon-hydrogen SiN layer may be an etch stop layer in a poly-metal dielectric level between the semiconductor body and the capacitor level.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
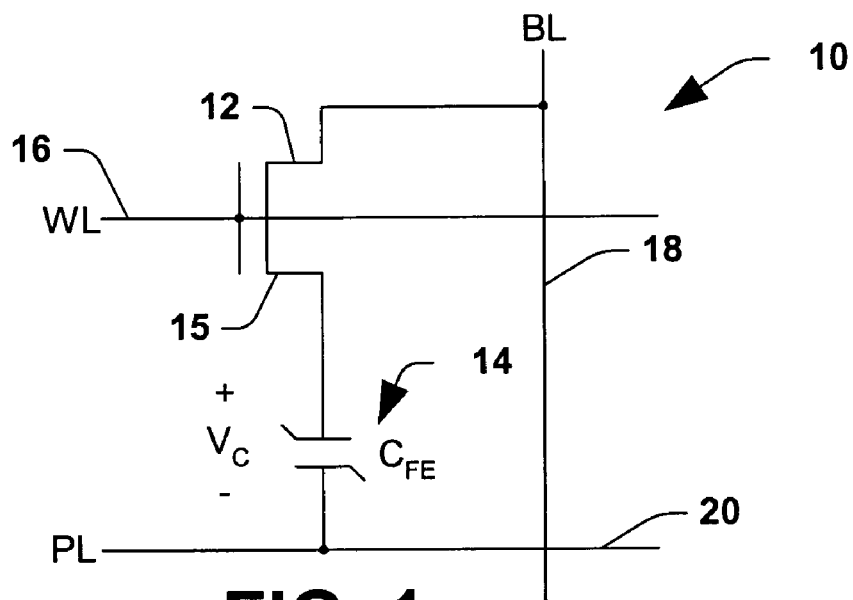
FIG. 1 is a schematic diagram illustrating an exemplary 1T/1C FERAM memory cell.
Figure 2:
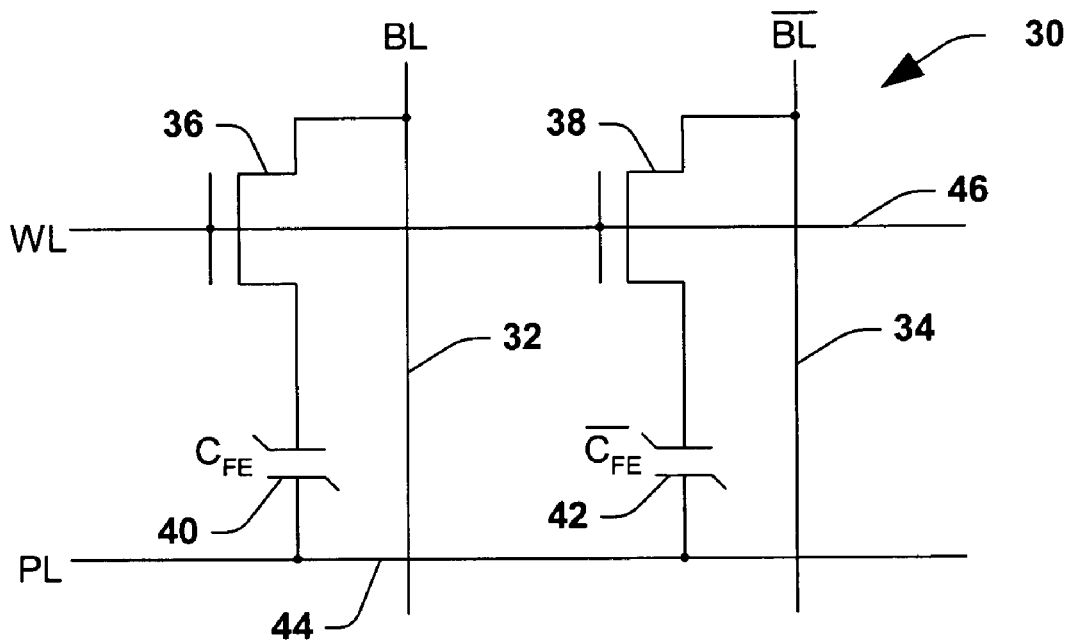
FIG. 2 is a schematic diagram illustrating an exemplary 2T/2C FERAM memory cell.

The present invention will now be described with reference to the attached drawing figures, wherein like reference numerals are used to refer to like elements throughout.

The invention relates to semiconductor devices and fabrication methods in which a hydrogen barrier is formed using low silicon-hydrogen silicon nitride (low Si—H SiN) to prevent or inhibit hydrogen related degradation of ferroelectric capacitors (e.g., degraded switched polarization properties) and/or degradation of transistors in a semiconductor device (e.g., NBTI). The inventors have appreciated that operational properties of ferroelectric materials may be severely degraded by exposure to hydrogen during processing of semiconductor devices, including back-end processing found in many CMOS integration schemes. In addition, hydrogen has been found to adversely degrade the performance of transistors, for example, by creating fixed oxide charge and interface traps at the transistor gate dielectric/silicon interface, leading to negative bias temperature instability (NBTI). This results in reduced drain saturation current (Idsat) and an increase in the transistor threshold voltage (Vsat).

The inventors have found that low silicon-hydrogen SiN films operate as a barrier to hydrogen diffusion, and therefore may be employed to protect ferroelectric capacitors and/or MOS transistors from hydrogenating processes during semiconductor device fabrication. In this respect, the provision of low silicon-hydrogen SiN layers above ferroelectric capacitors and/or above the device transistors prevents or inhibits damaging hydrogen from back-end metalization and other processing that follows transistor and/or ferroelectric capacitor formation.

Furthermore, the inventors have appreciated that SiN materials used as etch stop layers in conventional semiconductor products have a non-zero hydrogen content (e.g., and thus may be more accurately represented as $Si_xN_yH_z$), where the hydrogen content is contained in Si—H and to a lesser extent N—H bonds. The hydrogen in conventional high silicon-hydrogen SiN films tends to dissociate from the SiN material during thermal processing of a device wafer, where the dissociated hydrogen can further exacerbate degradation of the ferroelectric capacitors and transistors. In this regard, the inventors have further appreciated that the Si—H bonds in a SiN material are of lower bond energy (e.g., about 3.34 eV) than are the N—H bonds (e.g., about 4.05 eV). It is therefore believed that hydrogen in low Si—H SiN films has a lower tendency to dissociate than in conventional SiN (e.g., high silicon-hydrogen SiN) films in which the hydrogen content is largely bonded with silicon.

The present invention provides low silicon-hydrogen SiN barriers at one or more locations above the ferroelectric capacitors, alone or in combination with hydrogen barriers between the transistors and the ferroelectric capacitors, wherein the barriers may, but need not, be used as etch stop layers. The employment of one or more low silicon-hydrogen SiN layers facilitates integration of ferroelectric cell capacitor fabrication in conjunction with existing back-end interconnect (e.g., metalization) processing, while reducing or mitigating hydrogen-related ferroelectric and transistor degradation in stand-alone memory products or devices having embedded ferroelectric memory.

The invention may be employed in association with semiconductor devices having ferroelectric capacitors fabricated with any ferroelectric materials, including but not limited to PZT. In addition, the invention may be employed in conjunction with ferroelectric memories using any cell types and array architectures including but not limited to 1T-1C, 2T-2C, or other cell types organized in folded-bitline, open-bitline, chain-FRAM, or other array configurations. In addition, while one or more exemplary semiconductor devices are illustrated and described herein with ferroelectric capacitors formed in a dielectric layer or level (e.g., capacitor level) after front-end contact formation and prior to formation of overlying metalization levels, the invention may be employed in devices where ferroelectric capacitors are formed at any level in a multi-level semiconductor device design. Furthermore, the invention may be employed in semiconductor devices fabricated on or in any type of semiconductor body, including but not limited to silicon substrates or SOI wafers. In this regard, the invention is not limited to the examples illustrated and described herein, and all variant implementations providing low silicon-hydrogen SiN hydrogen barriers are contemplated as falling within the scope of the present invention and the appended claims.

Figure 3:
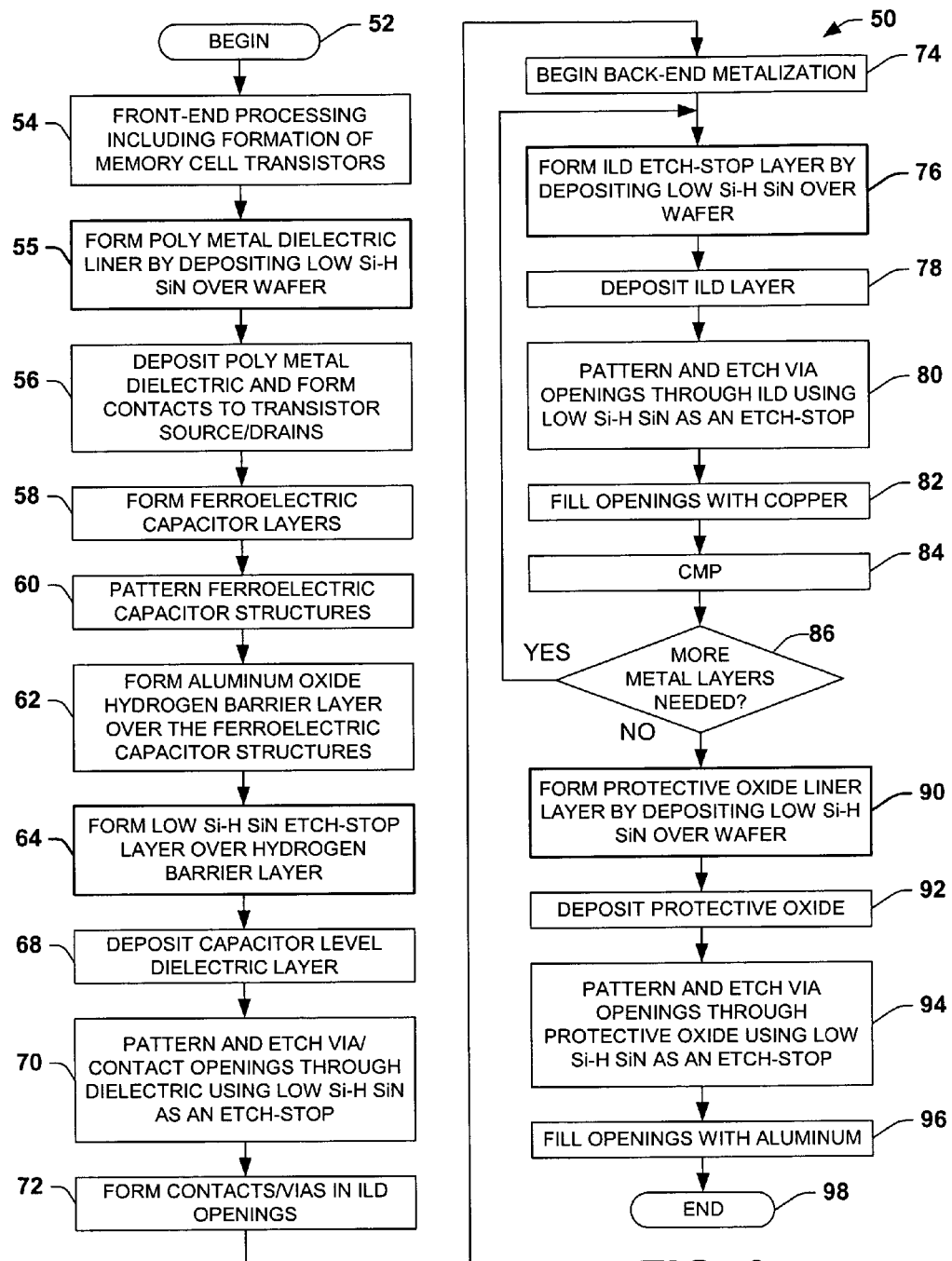
FIG. 3 is a flow diagram illustrating an exemplary method of fabricating a semiconductor device using one or more low silicon-hydrogen SiN layers in accordance with the present invention.

FIG. 3 provides a flow diagram illustrating an exemplary method 50 for fabricating a semiconductor device using one or more low silicon-hydrogen SiN layers in accordance with the present invention. While the method 50 and other exemplary methods are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the fabrication of devices illustrated and described herein as well as in association with other devices and structures not illustrated. For example, the exemplary method 50 may be employed in fabricating a semiconductor device 102 as illustrated and described below with respect to FIGS. 4A–4K, or other devices having one or more low silicon-hydrogen SiN layers formed at any level in the device.

Beginning at 52, front-end processing is performed at 54, including formation of transistors for the ferroelectric memory cells and other circuits within the device, using any suitable materials and processing steps. At 55, a liner is formed over the wafer, comprising a low silicon-hydrogen SiN material to protect the underlying transistors from diffusion of hydrogen in subsequent fabrication processing. The low silicon-hydrogen SiN liner may, but need not, operate as an etch stop layer in a poly metal dielectric (PMD) level during subsequent formation (e.g., etching) of openings through a subsequent PMD dielectric material for connection to the transistor gate and/or source/drains within the scope of the invention. The low silicon-hydrogen SiN liner formed at 55 has hydrogen primarily bonded to nitrogen, with little or no hydrogen bonded to silicon, as expressed by a Fourier Transform Infrared (FTIR) figure of merit value of about 0.05 or less, where the FTIR figure of merit is calculated as (Si—H absorbance/(N—H absorbance×1.4)) as illustrated and described further with respect to FIGS. 7 and 8 below. In one implementation, the FTIR figure of merit is about 0.04 or less, preferably about 0.03 or less. Any figure of merit may be used in accordance with the invention, which quantifies the relative amounts of silicon bonded hydrogen and nitrogen bonded hydrogen.

The low silicon-hydrogen SiN liner is preferably formed at 55 by depositing a low silicon-hydrogen SiN material above the transistors using a plasma enhanced chemical vapor deposition (PECVD) process having relatively high nitrogen ($N_2$) gas flow, and relatively low ammonia ($NH_3$) flow, so as to create the material having hydrogen content confined primarily to nitrogen-hydrogen bonds. In one example, an $N_2$ flow of about 10,000 sccm or more is used at 55, such as about 14,000 sccm or more, with an $NH_3$ flow of about 1,000 sccm or less, such as about 750 sccm or less. As illustrated and described below, one or more additional low silicon-hydrogen SiN layers may be formed in the semiconductor device to provide additional protection to the transistor (and to subsequently formed ferroelectric capacitors), for example, wherein low silicon-hydrogen SiN layers are employed as an etch stop layer in the capacitor level, an etch stop layer in one or more metalization levels, and/or as an etch stop layer in a protective oxide level above an uppermost metalization level.

The following table 1 provides process parameters for four exemplary implementations of a PECVD deposition process that may be employed in forming a low silicon-hydrogen layer (e.g., at 55 or other points in a fabrication process) within the scope of the invention.

TABLE 1

| Parameter | Recipe I | Recipe II | Recipe III |
|---|---|---|---|
| $N_2$ flow sccm | 14,000 | 4,500 | 1,500 |
| $SiH_4$ flow sccm | 150 | 50 | 100 |
| $NF_3$ flow sccm | 0 | 0 | 50 |
| $NH_3$ flow sccm | 750 | 250 | 700 |
| HFRF watts | 700 | 1000 | 1000 |
| LFRF watts | 100 | 300 | 300 |
| Pressure Torr | 2.25 | 2.7 | 2.8 |
| Temp deg. C. | 400 | 400 | 400 |
| F.O.M. Si—H/1.4N—H | 0.00 | 0.04 | 0.02 |

An initial inter-level or inter-layer dielectric (ILD) is then formed at 56 over the cell transistors and over the low silicon-hydrogen SiN PMD liner, using any suitable dielectric material and deposition process, where the initial ILD is referred to herein as the poly metal dielectric (PMD). Conductive contacts are formed through the PMD to provide electric connection to the transistor bitline source/drains (e.g., source/drain 12 in FIG. 1 above), as well as to the source/drains for connection with subsequently formed ferroelectric capacitors (e.g., source/drain 15 in FIG. 1). Any suitable front-end etching and contact formation steps and materials may be employed at 56 within the scope of the invention. In this example, moreover, the initial low silicon-hydrogen SiN PMD liner formed at 55 may operate as an etch stop layer during formation of the contact openings.

At 58, ferroelectric capacitor layers are formed over the PMD dielectric and the contacts, including formation of upper and lower conductive capacitor electrode or plate layers and a ferroelectric material layer between the electrode layers, using any suitable conductive and ferroelectric materials and deposition processes. The capacitor layers are then patterned at 60, for example, using suitable masking and etching steps to define ferroelectric capacitor structures having first and second conductive electrodes and a ferroelectric material disposed between the electrodes.

A multi-layer hydrogen barrier is then formed at 62 and 64 above the ferroelectric capacitors to prevent or inhibit hydrogen diffusion into the ferroelectric material in subsequent (e.g., back-end) processing of the device. In the illustrated example, a first hydrogen barrier layer is formed at 62 over the patterned ferroelectric capacitor structures by depositing aluminum oxide (AlOx) over the ferroelectric capacitors. Other materials may alternatively be deposited at 62 that do not react with the ferroelectric material of the underlying ferroelectric capacitor structures. In one example, AlOx is deposited at 62 to a thickness of about 400 Å using physical vapor deposition (PVD). In another implementation, AlOx is deposited to a thickness of about 100 Å at 62 using atomic layer deposition (ALD), although other materials and deposition processes are possible within the scope of the invention, where a non-reactive material is formed over or above the ferroelectric capacitors.

According to another aspect of the invention, a second hydrogen barrier layer is formed at 64 by deposition of low silicon-hydrogen SiN over the AlOx layer, for example, using the PECVD processes set forth in Table 1 above or other suitable deposition techniques, to provide a SiN layer having an FTIR figure of merit (Si—H/1.4N—H) of about 0.05 or less. In alternative implementations of this aspect of the invention, one or more additional hydrogen barrier layers may be formed between the aluminum oxide and the low silicon-hydrogen SiN and/or over the low silicon-hydrogen SiN. Although the first barrier layer (e.g., AlOx) ideally operates to inhibit the diffusion of hydrogen into the underlying ferroelectric material, the inventors have appreciated that the formation of a low silicon-hydrogen SiN layer over the AlOx aids in preventing or mitigating hydrogen related performance degradation of the ferroelectric capacitors and the transistors.

Figure 4A:
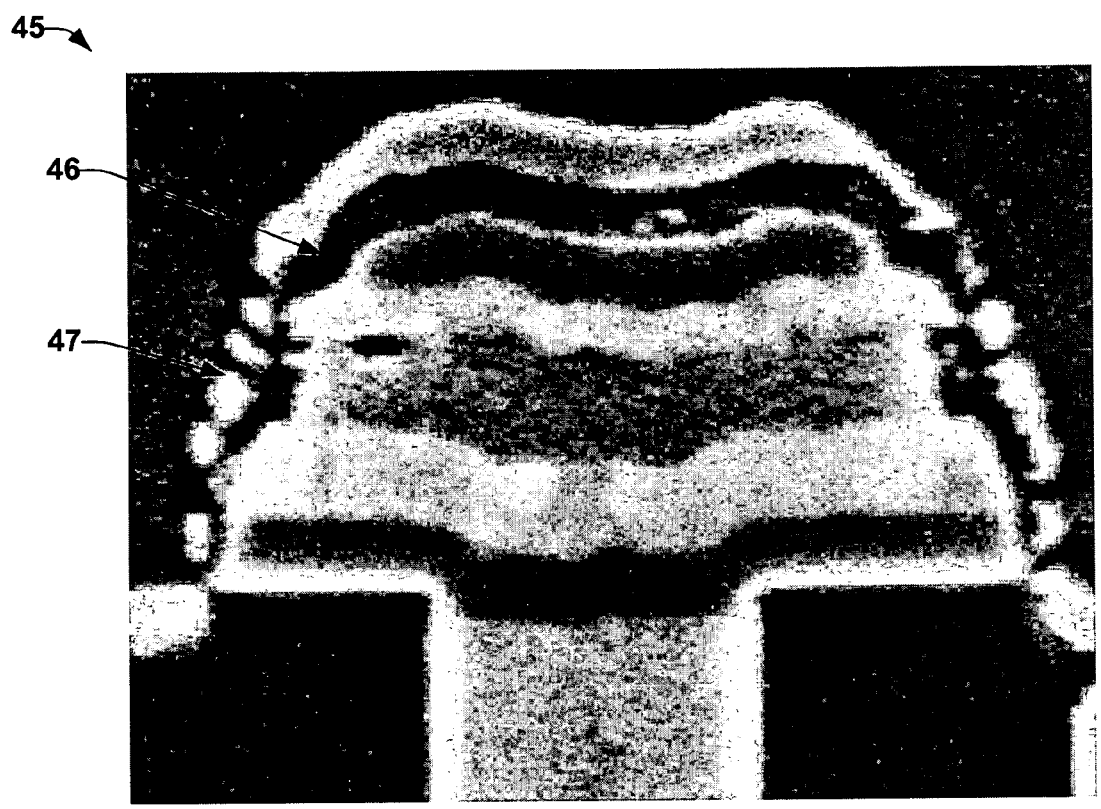
FIG. 4A is a partial side elevation view in section illustrating a ferroelectric capacitor stack having an aluminum oxide hydrogen barrier and a non-conformal conventional high density plasma SiN layer.
Figure 4B:
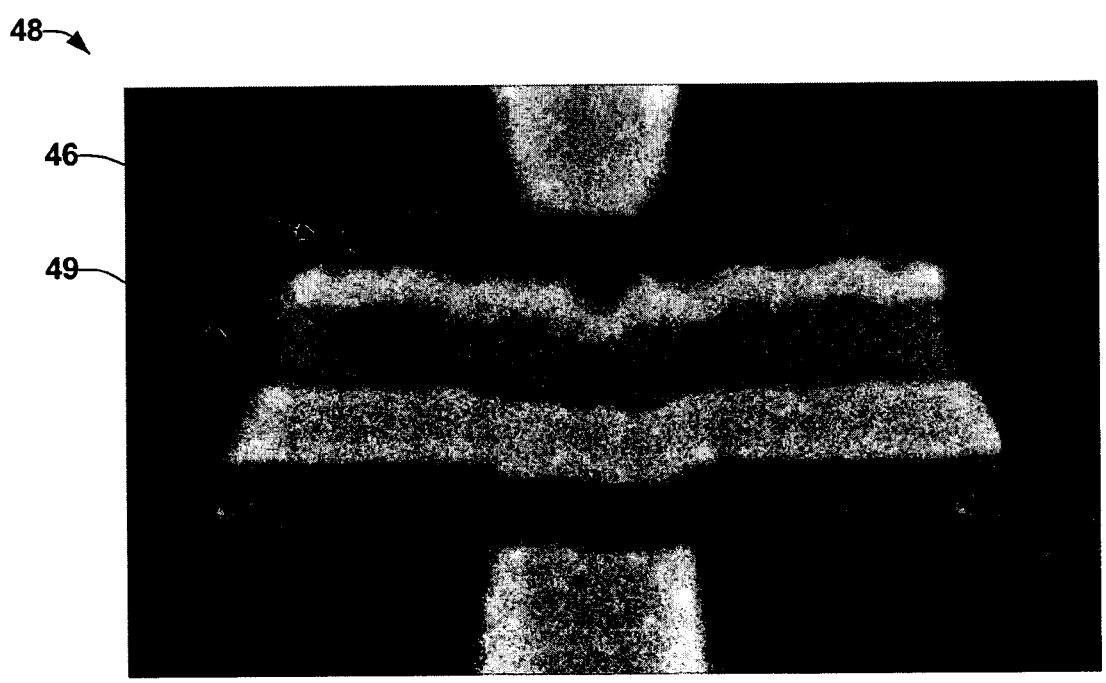
FIG. 4B is a partial side elevation view in section illustrating a ferroelectric capacitor stack having an aluminum oxide hydrogen barrier and a conformal low silicon-hydrogen SiN layer in accordance with the invention.

Referring also to FIGS. 4A and 4B, the inventors have found that PECVD deposition of the low silicon-hydrogen SiN layer provides conformal coverage even along the sidewalls of the ferroelectric capacitor structures. This provides more effective protection to the lateral edges of the capacitor ferroelectric material than conventional high density plasma (HDP) deposition techniques. FIG. 4A illustrates a ferroelectric capacitor stack 45 having an aluminum oxide hydrogen barrier 46 and a non-conformal conventional (e.g., high silicon-hydrogen) SiN etch stop layer 47 deposited thereover using HDP deposition techniques. As can be seen, although the etch stop layer 47 is fairly conformal at the top of the capacitor stack 45, the lateral sides of the stack 45 are not uniformly covered. This is believed to be the result of sputtering during the high density plasma processing.

FIG. 4B illustrates an exemplary ferroelectric capacitor stack 48 having an aluminum oxide hydrogen barrier layer 46 and a conformal low hydrogen-silicon nitride layer 49 deposited using PECVD techniques in accordance with the present invention. As can be seen in FIG. 4B, the PECVD techniques provide more uniform coverage of the capacitor stack 48 at the lateral edges (e.g., as well as uniformity at the top), whereby the exemplary low silicon-hydrogen layer formed at 64 may operate as an effective hydrogen barrier as well as an etch stop layer. In other possible implementations, the low silicon-hydrogen SiN may be employed anywhere in the capacitor level, wherein an aluminum oxide layer may, but need not, be provided in the capacitor level.

A capacitor level dielectric material (ILD) is then deposited at 68 over the low silicon-hydrogen SiN (e.g., and any intervening additional hydrogen barrier layers). The capacitor level ILD dielectric is then patterned and etched at 70 to form via/contact openings for electrical coupling to the upper ferroelectric capacitor electrodes and to the previously formed bitline contacts in the underlying PMD level. During the etching at 70, the low silicon-hydrogen SiN layer may serve as an etch stop layer. The openings are then filled with conductive material (e.g., copper, aluminum, tungsten, or other conductive material) at 72 to form the bitline and capacitor contacts in the current ILD (e.g., in the capacitor level), after which back-end (e.g., metalization or interconnect) processing begins at 74.

Another aspect of the invention provides low silicon-hydrogen SiN layers in one or more of the back-end metalization levels, alone or in combination with the low silicon-hydrogen SiN barriers above the ferroelectric capacitors (e.g., in the capacitor level) and/or between the transistors and the ferroelectric capacitors (e.g., in the PMD level). One or more metalization levels are constructed above the capacitor level at 76–86, wherein the metal levels may individually comprise one or more layers of ILD dielectric material with conductive interconnect routing structures (e.g., trenches, vias, etc) being formed using any suitable techniques, including but not limited to single and/or dual damascene methods. At 76, a low silicon-hydrogen SiN layer is formed above the capacitor level ILD and above the capacitor level contacts/vias, having an FTIR figure of merit (Si—H/1.4N—H) of about 0.05 or less, which operates as a first metalization level ILD etch stop layer in this example. Any of the above process recipes (e.g., Table 1) can be used for PECVD deposition of the low silicon-hydrogen SiN etch stop layer at 76, or other deposition processes may be performed at 76 within the scope of the invention to form a low silicon-hydrogen SiN layer.

An interlevel dielectric material (ILD) is then deposited at 78 over the low silicon-hydrogen SiN etch stop layer, and the ILD layer is then patterned and etched at 80 to form trench and/or via openings for electrical coupling to the underlying conductive vias/contacts in the capacitor level. In this example, the low silicon-hydrogen SiN layer formed at 76 is used as an etch stop for etching the openings at 80, although other implementations are possible where one or more low silicon-hydrogen SiN layers are provided in a metalization level for protecting ferroelectric capacitors and/or transistors against hydrogen diffusion, wherein the low silicon-hydrogen SiN layers may, but need not, operate or be employed as an etch-stop layer, wherein all such variant implementations are contemplated as falling within the scope of the present invention. The ILD openings are then filled with conductive material at 82 to form first metalization level routing structures (e.g., METAL 1 level). The wafer is then planarized, for example, using chemical mechanical polishing (CMP) techniques at 84 to complete the first metal level.

A determination is then made at 86 as to whether additional metal layers or levels are needed, and if so, the method 50 repeats at 76–84. Any number of such metalization levels or layers can thus be created, each formed over the preceding metalization level, wherein a low silicon-hydrogen SiN layer may be included at 76 to protect against hydrogen diffusion into underlying levels and devices (e.g., particularly the ferroelectric capacitors and transistors). In this regard, any such low silicon-hydrogen SiN layer may, but need not, also function as an etch stop layer during formation of ILD openings for vias, trenches, etc at a particular metalization level.

Once the desired multi-level metalization structure is finished (e.g., NO at 86), a protection structure is formed at 90–96 with conductive pads to provide external connection to certain metalization features in the uppermost metalization level. At 90, a protective oxide liner layer is formed by depositing a low silicon-hydrogen SiN material using the above-mentioned PECVD process or other suitable techniques. The low silicon-hydrogen SiN liner material preferably has an FTIR figure of merit (Si—H/1.4N—H) of about 0.05 or less for protecting the underlying materials and components from hydrogen. A protective oxide is then deposited over the liner at 92, using any suitable dielectric material by any suitable deposition process to create a protection layer, which is then selectively etched at 94 using the low silicon-hydrogen SiN liner as an etch stop layer. The openings in the protective oxide are then filled with aluminum or other conductive material at 96 before the method 50 ends at 98.

Referring now to FIGS. 5A–5K, an exemplary semiconductor device 102 is illustrated undergoing fabrication processing according to the present invention, wherein the device 102 is processed generally according to the method 50 to include low silicon-hydrogen SiN hydrogen barrier layers over the transistors, above the ferroelectric capacitors, in the metalization levels, as well as in a protective oxide level. However, as with the methods described above, a semiconductor device in accordance with the invention may include a low silicon-hydrogen SiN protective layer at one, some, or all of these levels, wherein the protective barrier layers may, but need not, also function or be employed as etch stop layers. In the examples illustrated and described herein, the structures are not necessarily drawn to scale, and generally may be fabricated using any suitable materials and semiconductor processing techniques.

Figure 5A:
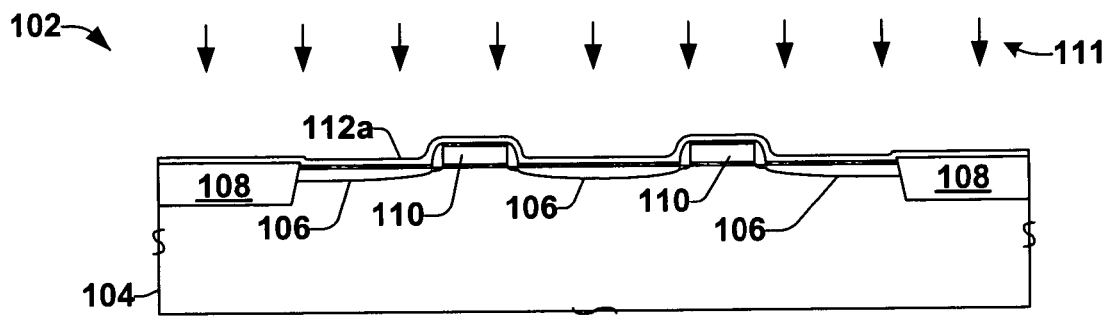
FIGS. 5A–5K are partial side elevation views in section illustrating an exemplary semiconductor device having low silicon-hydrogen SiN layers in accordance with the invention undergoing fabrication processing generally according to the method of FIG. 3.

FIG. 5A illustrates the device 102 after front-end processing in which cell transistors have been formed on or in a semiconductor body 104 prior to fabrication of a poly metal dielectric (PMD) level. The device 102 includes a semiconductor body 104 (e.g., silicon or other semiconductor substrate, SOI wafer, etc.) in which transistor source/drains 106 are formed in active regions separated by STI or LOCOS isolation structures 108, wherein gate structures 110 are formed over channel regions of the substrate 104 as part of polysilicon wordline structures for a ferroelectric memory array. MOS type cell transistors are thus formed by the gates 110 and the source/drains 106, wherein the source/drains 106 are formed by doping portions of active regions in the substrate, and wherein the source/drain 106 coupled with a memory array bitline (e.g., the middle source/drain 106 in FIGS. 5A–5K) is shared between adjacent transistors.

As illustrated in FIG. 5A, a PECVD or other suitable deposition process 111 is performed to deposit a low silicon-hydrogen SiN liner layer 112a above the transistors. As discussed above with respect to FIG. 4B, the process 111 is preferably a PECVD process employing fairly low ammonia flow ($NH_3$) and high $N_2$ flow to provide both a conformal low silicon-hydrogen SiN liner layer 112a, and relatively few, if any, silicon-hydrogen bonds, thereby protecting the transistor from hydrogen associated with subsequent fabrication processing and thermally dissociated hydrogen. In addition, the layer 12a in the exemplary device 102 also functions as an etch stop layer. In the device 102, moreover, the low silicon-hydrogen SiN liner layer 112a has an FTIR figure of merit related to the relative amounts of Si—H and N—H bonds (e.g., Si—H/1.4N—H) of less than or equal to about 0.05 in accordance with the invention.

Figure 5B:
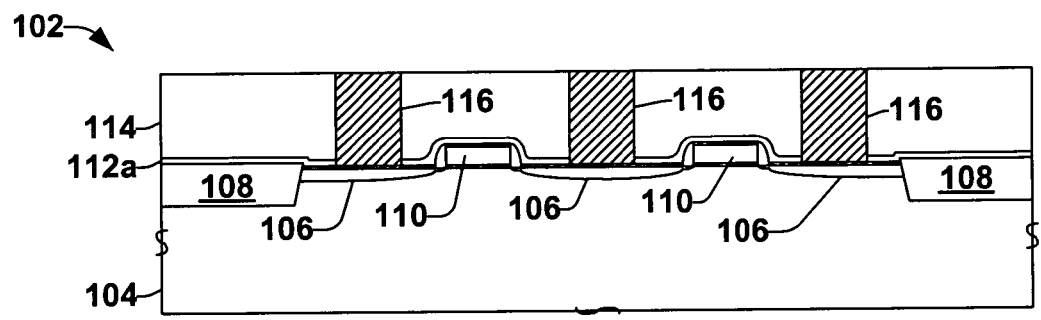

In FIG. 5B, a poly metal dielectric (PMD) layer 114 is formed over the liner 112a, the transistors, and the substrate 104, through which conductive contacts 116 are formed for interconnection of the source/drain terminals 106, where the contacts 116 may be formed of any conductive material or materials, such as tungsten or the like. As described above, during formation of the openings for the contacts 116, the exemplary low silicon-hydrogen SiN liner layer 112a acts as an etch stop layer.

Figure 5C:
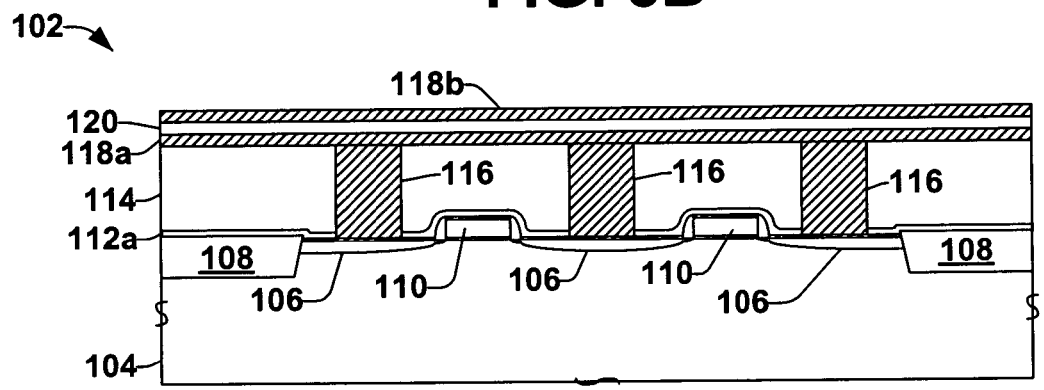
Figure 5D:
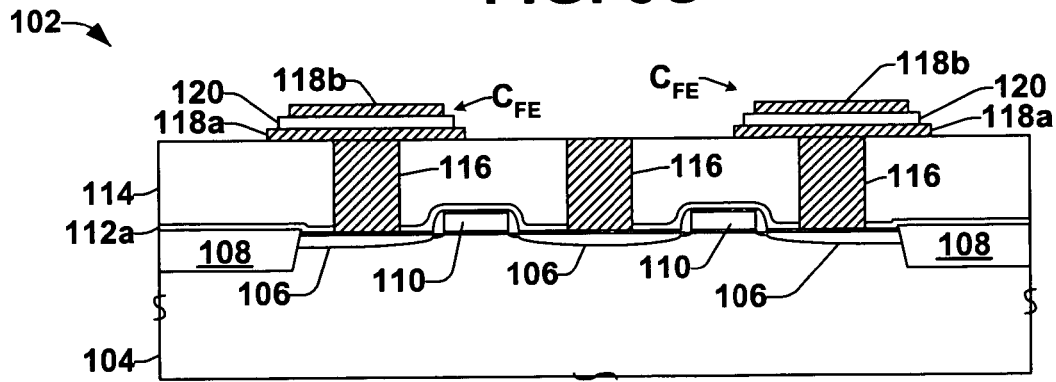

As illustrated in FIGS. 5C and 5D, ferroelectric cell capacitors $C_{FE}$ are then formed over the PMD layer 114. In FIG. 5C, capacitor layers are deposited, including upper and lower conductive electrode or plate layers 118b and 118a, respectively, with a ferroelectric material layer 120 formed between the electrode layers 118. The capacitor electrodes 118 may be formed of any suitable material or combination of multiple layers of materials. In one example, a diffusion barrier is first created comprising TiN formed over the PMD dielectric 114 and the tungsten contacts 116 via chemical vapor deposition (CVD) with a TiAlN film or a TiAlON being deposited thereover using a physical vapor deposition (PVD) or other process. The bottom electrode material 118a is then formed over the diffusion barrier, for example, comprising any conductive material such as Pt, Pd, PdOx, IrPt alloys, Au, Ru, $RuO_x$, $(Ba,Sr,Pb)RuO_3$, $(Sr,Ba,Pb)IrO_3$, Rh, $RhO_x$, $LaSrCoO_3$, $(Ba,Sr)RuO_3$, $LaNiO_3$, etc., or any stack or combination thereof.

Ferroelectric material 120 is then deposited over the lower electrode material 118a using any appropriate deposition techniques such as metal organic chemical vapor deposition (MOCVD) using any suitable ferroelectric materials, including but not limited to $Pb(Zr,Ti)O_3$ PZT (lead zirconate titanate), doped PZT with donors (Nb, La, Ta) acceptors (Mn, Co, Fe, Ni, Al) and/or both, PZT doped and alloyed with $SrTiO_3$, $BaTiO_3$ or $CaTiO_3$, strontium bismuth tantalate (SBT) and other layered perovskites such as strontium bismuth niobate tantalate (SBNT) or bismuth titanate, $BaTiO_3$, $PbTiO_3$, $Bi_2TiO_3$, etc. The top electrode material 118b may be a single layer or a multi-layer conductive structure such as $IrO_x$, $RuO_x$, $RhO_x$, $PdO_x$, $PtO_x$, $AgO_x$, $(Ba,Sr)RuO_3$, $LaSrCoO_3$, $LaNiO_3$, $YBa_2Cu_3O_{7-x}$ with a noble metal layer thereover, wherein the layers 118 and 120 may be formed to any desired thickness in accordance with the invention.

The ferroelectric capacitor material layers are then patterned as illustrated in FIG. 5D using masking and etch processes (not shown) to define the ferroelectric capacitor structures $C_{FE}$ having any desired size (area) and shape. In the exemplary array configuration of the device 102, the first contacts 116 couple the lower capacitor electrodes 118a with a first source/drain 106 of the cell transistors, and the shared source/drain is coupled with another contact 116 for connection with a subsequently formed bitline structure for reading and writing data.

Figure 5E:
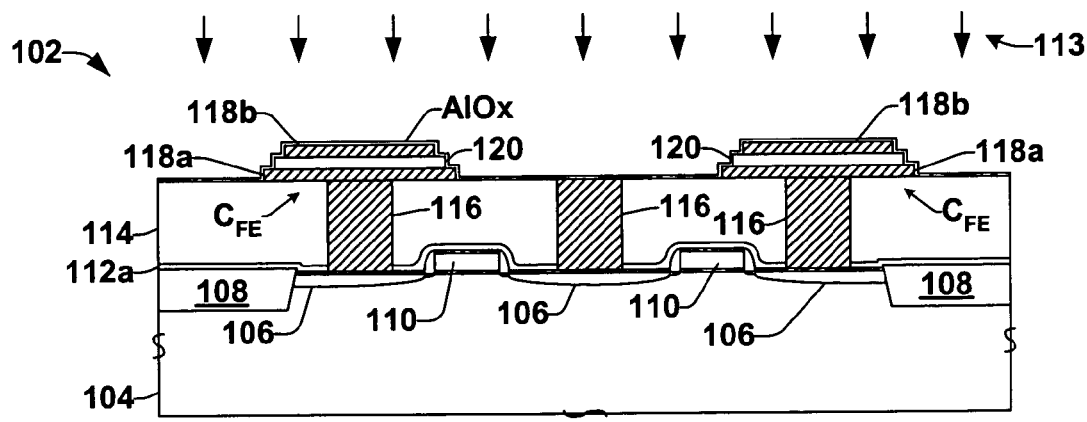
Figure 5F:
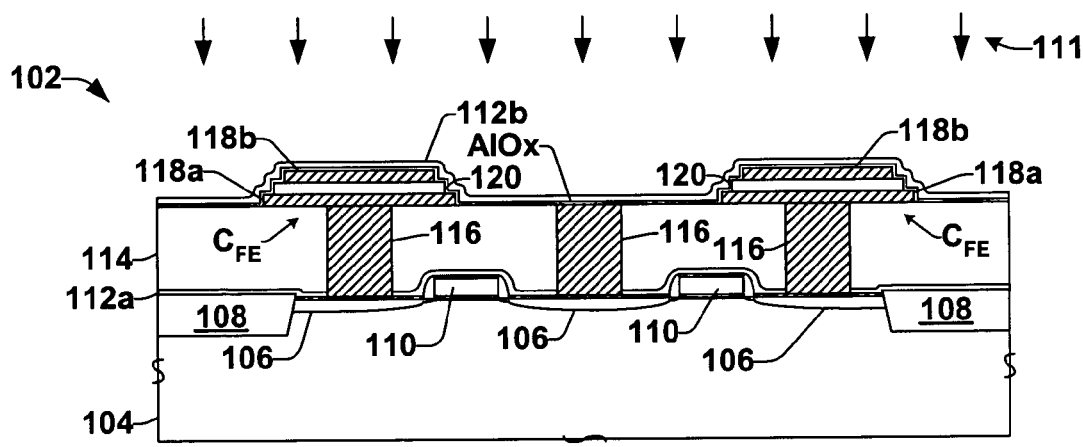

Referring now to FIGS. 5E and 5F, a hydrogen barrier is then formed above the ferroelectric capacitors $C_{FE}$ in accordance with an aspect of the invention. In FIG. 5E, a deposition process 113 is employed to form a hydrogen barrier layer AlOx to any desired thickness, where the AlOx layer may be aluminum oxide or any other material that does not react with the ferroelectric material 120 of the capacitors $C_{FE}$. In one example, the process 113 is a PVD process providing an aluminum oxide layer AlOx having a thickness of about 400 Å. In another implementation, an ALD process 113 is used to deposit the AlOx layer to a thickness of about 100 Å.

In FIG. 5F, another low silicon-hydrogen SiN layer 12b is deposited to any desired thickness, such as a few hundred angstroms, using the PECVD process 111 described above, although other deposition processes and thickness can be used within the scope of the invention. In this regard, while the various low silicon-hydrogen SiN layers 112 in the device 102 are illustrated as being the same material deposited using the same process 111, these layers can be of different low silicon-hydrogen SiN material, and may be deposited by different deposition techniques and/or to different thicknesses within the scope of the invention.

Figure 5G:
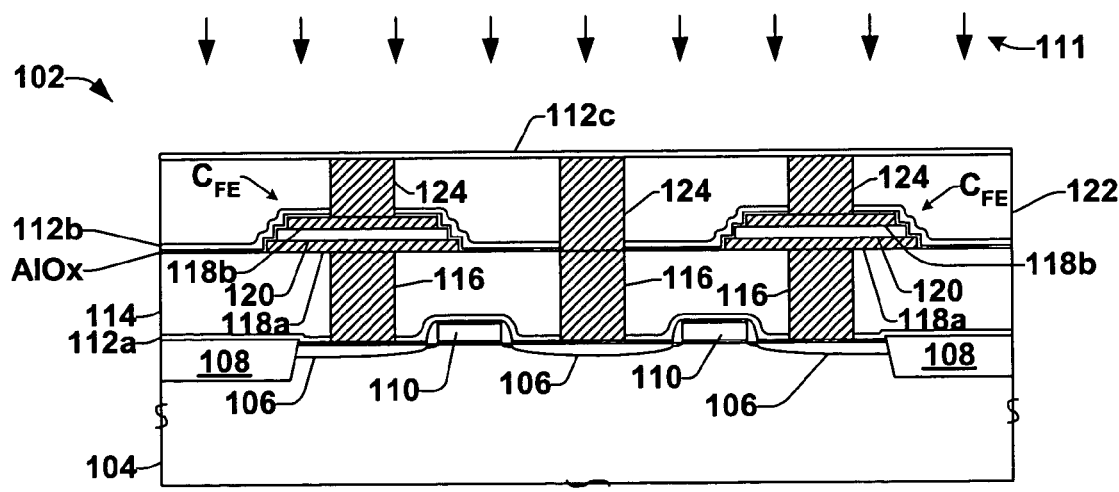

In FIG. 5G, another ILD layer 122 is formed in the capacitor level over the ferroelectric capacitor structures $C_{FE}$, the bitline contacts 116, the PMD dielectric 114, and the low silicon-hydrogen SiN layer 112b, where the ILD material 122 may be silicon dioxide ($SiO_2$), FSG, or other suitable dielectric. Openings are etched in the dielectric layer 122 using the low silicon-hydrogen SiN layer 12b as an etch stop layer. The openings through the ILD material 122 are then filled with conductive material (e.g., tungsten, copper, etc.) to form conductive via structures 124 for coupling with the upper capacitor plates 118b and the bitline contacts 116 of the capacitor level. The wafer is thereafter planarized (e.g., using CMP or other techniques), thereby completing the capacitor layer or level in the device 102.

Figure 5H:
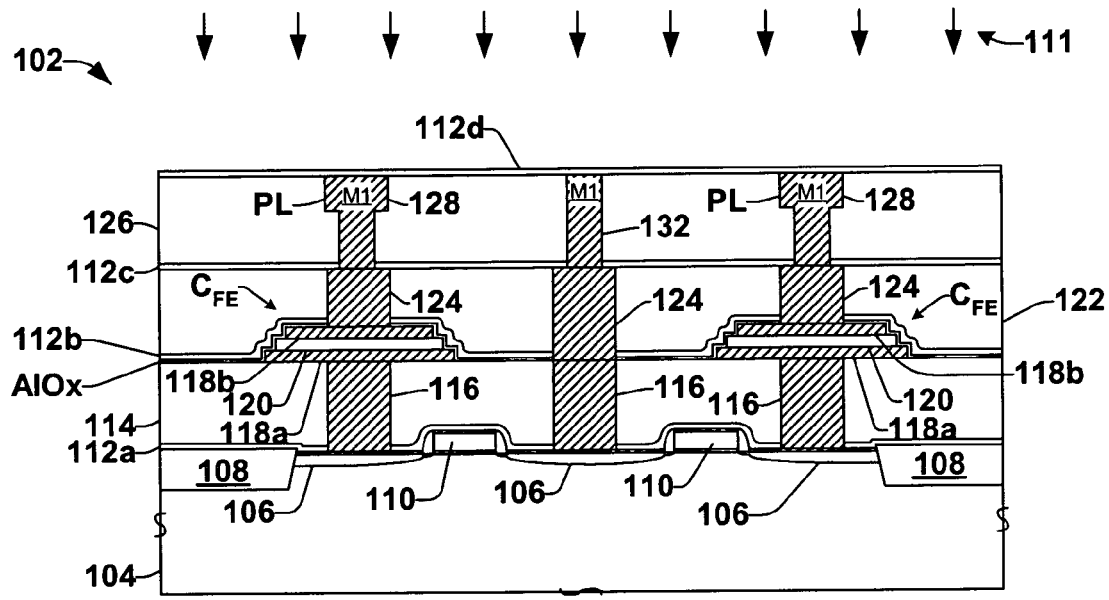

Another low silicon-hydrogen SiN layer 112c is then deposited using the process 111 in FIG. 5G to provide a hydrogen barrier over the capacitor level. As with the other low silicon-hydrogen SiN layers 112, the layer 112c has an FTIR figure of merit related to the relative amounts of Si—H and N—H bonds (e.g., Si—H/1.4N—H) of about 0.05 or less, and may be deposited using the exemplary PECVD process 111 or other suitable deposition techniques. In FIG. 5H, yet another ILD dielectric layer 126 is formed over the ferroelectric capacitor level and over the low silicon-hydrogen SiN layer 112c, and etched to form single and/or dual damascene type openings using the low silicon-hydrogen SiN layer 112c as an etch stop layer. A first layer of metal interconnect structures (M1) is formed therein (e.g., by deposition and subsequent CMP planarization), including conductive plateline routing structures 128 and bitline connection vias 132, thereby completing the first metalization level in the device 102.

Figure 5I:
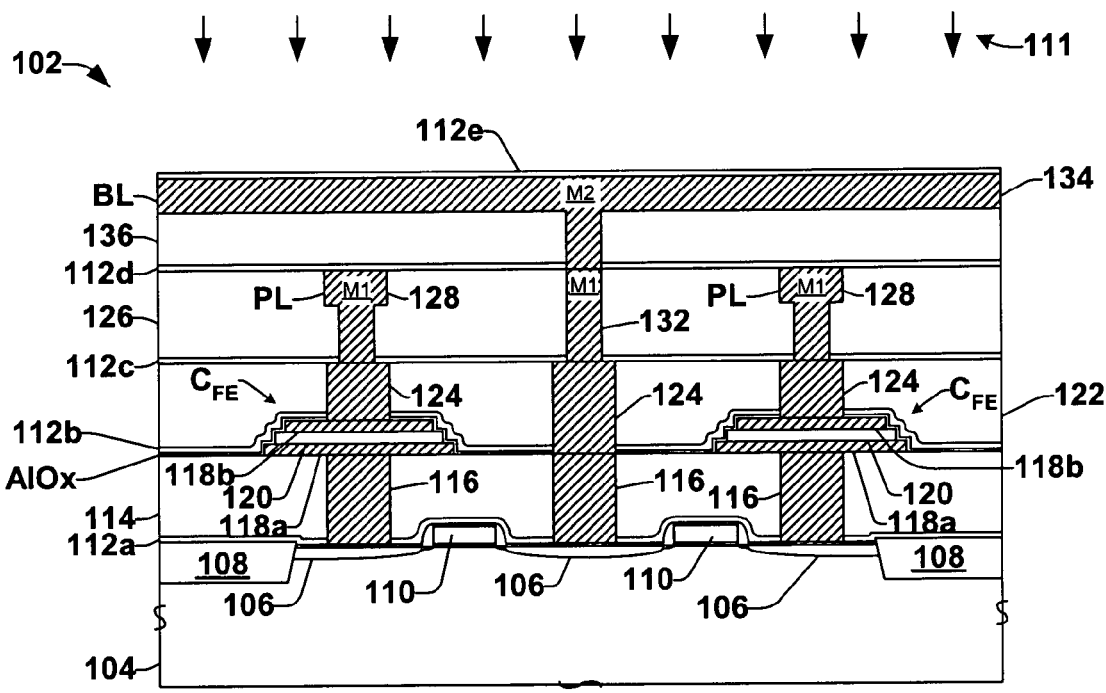

In FIG. 5H, still another low silicon-hydrogen SiN layer 112d is formed using the deposition process 111 to provide a hydrogen barrier over the first metalization level. Referring also to FIG. 5I, another ILD layer 136 is then formed in a second metalization level over the low silicon-hydrogen SiN layer 112d using any suitable dielectric material and deposition process, and openings (e.g., vias and/or trenches) are etched through the dielectric layer 136 using the SiN layer 112d as an etch stop layer. The openings are then filled with conductive material and the wafer is planarized to form conductive bitline via and interconnect structures 134 thereby completing the second metalization level.

Another low silicon-hydrogen SiN layer 112e is then formed in FIG. 5I using the deposition process 111 to provide a hydrogen barrier over the second metalization level. Any number of such metalization levels may be similarly constructed in the device 102, where none, some, or all such metalization levels may include a low silicon-hydrogen SiN layer to inhibit hydrogen diffusion. In the illustrated device 102, a third metalization level is constructed above the low silicon-hydrogen SiN layer 112e in FIG. 5J, including another ILD layer 140 and conductive routing structures 142, wherein openings for vias (not shown) in the third metalization level may be etched using the low silicon-hydrogen SiN layer 112e as an etch stop layer.

Figure 5J:
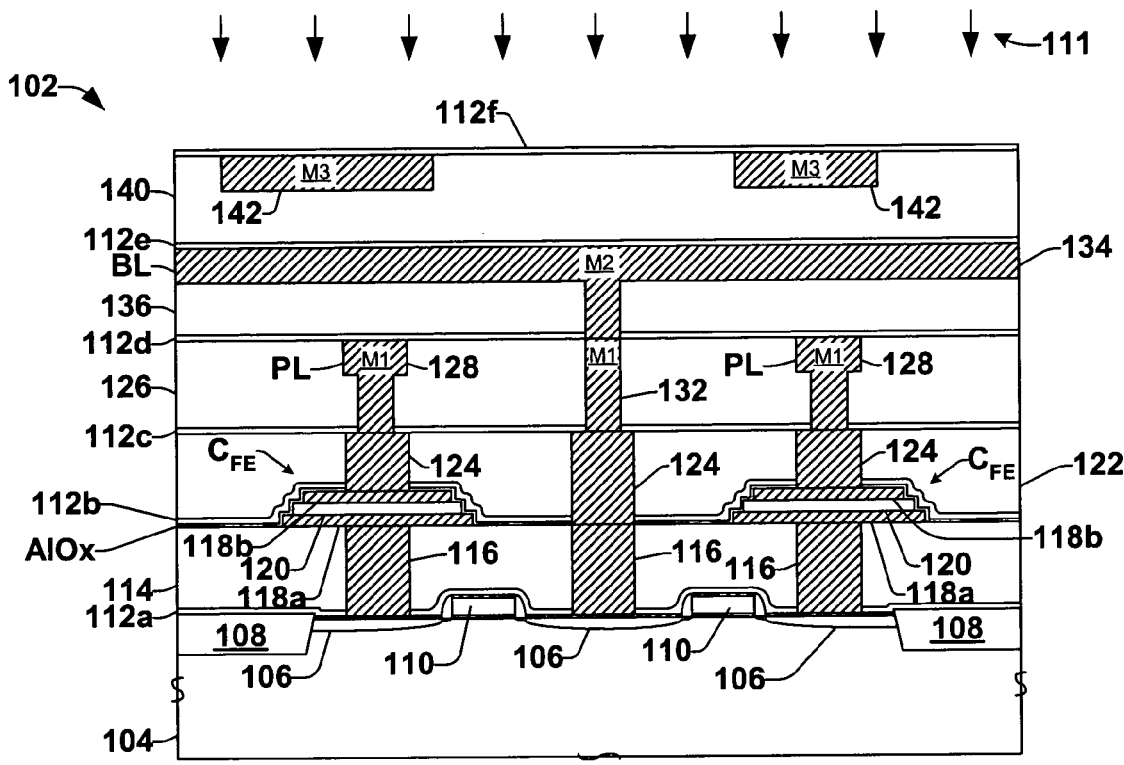
Figure 5K:
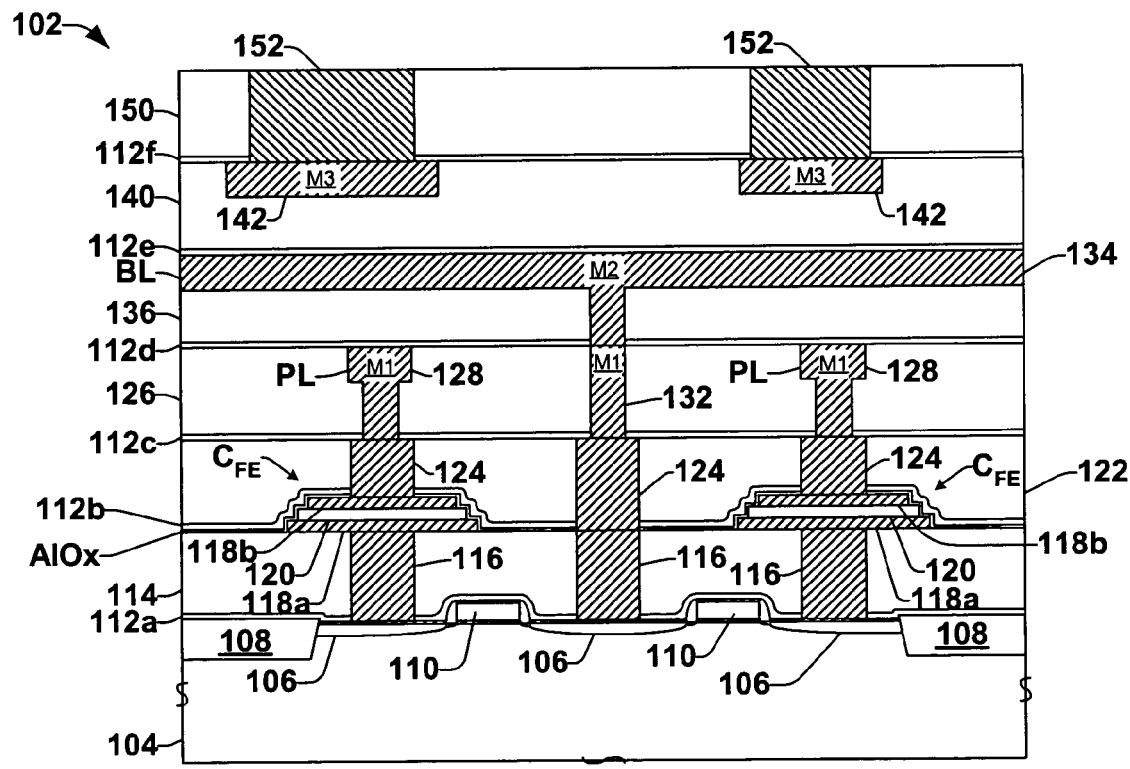

As illustrated in FIG. 5J, once the uppermost metalization level is completed (e.g., M3 in this example), another low silicon-hydrogen SiN layer 112f is formed using the deposition process 111 to provide a hydrogen barrier over the final metalization level. The layer 112f serves as a liner for a subsequently formed protective oxide (e.g., a protective oxide liner), as well as an etch stop layer (e.g., protective oxide level etch stop layer) in forming openings in the protective oxide. In FIG. 5K, a protective oxide material 150 is deposited over the liner 112f, and openings are etched therethrough using the liner 112f as an etch stop layer. The openings are then filled with conductive material (e.g., aluminum, etc.) to form conductive pads 152 for use in providing external electrical connection to one or more circuit nodes in the completed device 102 (e.g., for connection to integrated circuit pins during device packaging).

Many combinations and permutations of the inventive aspects may be implemented in a given semiconductor device within the scope of the invention. For example, low silicon-hydrogen SiN layers may be formed alone or in combination in one, some, or all of the PMD, ferroelectric capacitor, ILD/metalization, and protective oxide levels in a given device. These low silicon-hydrogen SiN layers may, but need not, be located within such a level so as to also serve as an etch stop layer. Where multiple low silicon-hydrogen SiN layers are provided, they may, but need not be deposited using the same or even similar deposition processes, and these layers may be of the same or different thicknesses. PECVD processes may, but need not, be employed to provide conformal low silicon-hydrogen SiN layers, which is particularly useful in such layers formed above the ferroelectric capacitor structures, transistors, and other topographical features. In addition, the low silicon-hydrogen SiN layers may be of any SiN material having an FTIR figure of merit related to the relative amounts of Si—H and N—H bonds (e.g., Si—H/1.4N—H) of about 0.05 or less, as discussed below with respect to FIGS. 7–9B.

Figure 6A:
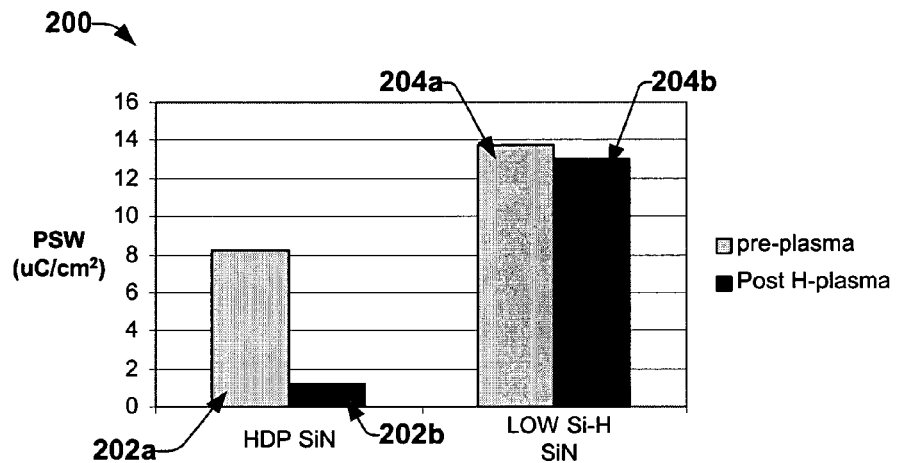
FIG. 6A is a chart illustrating comparative ferroelectric capacitor switched polarization (PSW) values for a device having a conventional high density plasma (HDP) capacitor level SiN etch stop layer and a device having an exemplary low silicon-hydrogen SiN capacitor level etch stop layer in accordance with the invention, both before and after processing using a hydrogen plasma.
Figure 6B:
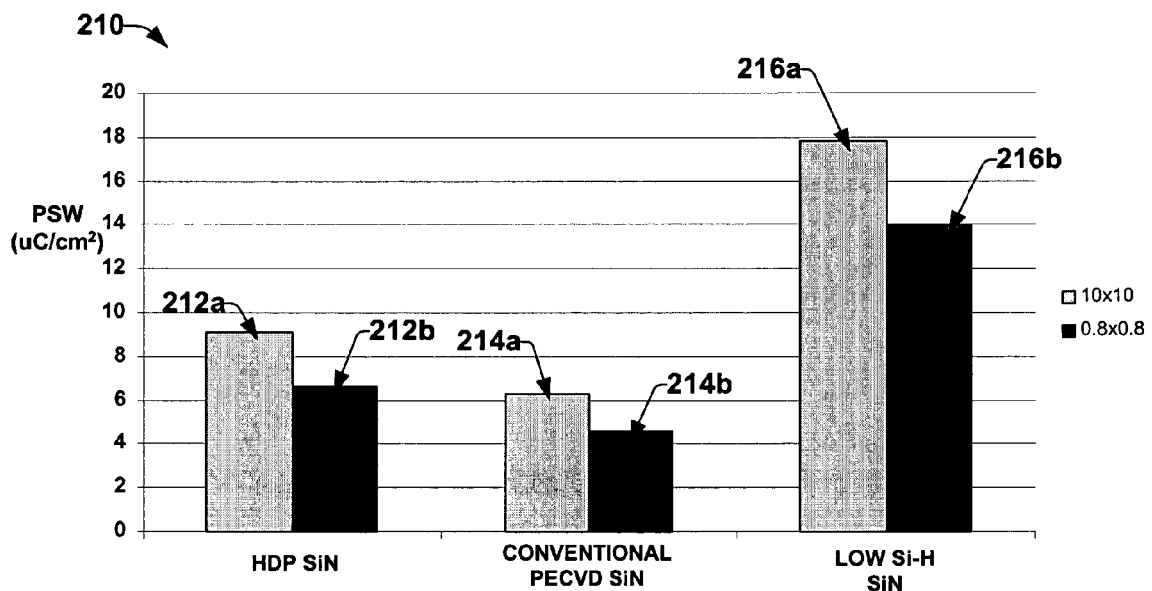
FIG. 6B is a chart illustrating comparative ferroelectric capacitor switched polarization values for devices having a conventional high density plasma (HDP) SiN capacitor level etch stop layer, devices having a conventional plasma enhanced chemical vapor deposition (PECVD) high silicon-hydrogen SiN capacitor level etch stop layer, and a device having an exemplary low silicon-hydrogen PECVD SiN capacitor level etch stop layer in accordance with the invention, following fabrication of five metalization levels over the ferroelectric capacitor level, for two different ferroelectric capacitor sizes.

Referring now to FIGS. 6A and 6B, exemplary experimental results are provided to illustrate the hydrogen protection afforded to ferroelectric memory capacitors by the low silicon-hydrogen SiN layers of the invention. FIG. 6A illustrates a plot 200 of comparative ferroelectric capacitor switched polarization values 202a and 202b (PSW in $uC/cm^2$) for a semiconductor device having conventional high density plasma (HDP) capacitor level SiN etch stop layer, and values 204a and 204b for a device having an exemplary low silicon-hydrogen SiN capacitor level etch stop layer in accordance with the invention. The values 202 and 204 are provided for semiconductor devices having a single metalization level formed using a hydrogen plasma etch process, where switched polarization values are provided both before hydrogen plasma processing (values 202a and 204a) and after hydrogen plasma processing (values 202b and 204b). In each of the tested devices, a single SiN layer was employed over the ferroelectric capacitors, wherein the first device (values 202) used a conventional (e.g., high silicon-hydrogen) HDP SiN material, and the second device (values 204) employed a low silicon-hydrogen SiN layer (e.g., layer 112b in the device 102 above).

As shown in the results of the plot 200, the exemplary device with the single low silicon-hydrogen SiN layer has significantly better switched polarization, believed to result from better ability to inhibit diffusion from the plasma process hydrogen (e.g., values 204a and 204b are relatively close, whereas values 202a and 202b are different from one another), as well as a lower chance of hydrogen in the layer dissociating and degrading the ferroelectric material (e.g., value 204a is much better than value 202a even before the plasma processing). Furthermore, as illustrated and described above with respect to FIGS. 4A and 4B, the PECVD deposition process for the low silicon-hydrogen SiN provides much more conformal coverage along the lateral sides of the ferroelectric capacitor structures, whereby improved protection is believed to be also related to this factor.

FIG. 6B provides a plot 210 illustrating comparative ferroelectric capacitor PSW values for three devices having a SiN layer formed above the ferroelectric capacitors, with standard back-end processing to form 5 metalization levels above the capacitor level (e.g., no low silicon-hydrogen SiN layers were employed in the back-end). Tests were run for two different ferroelectric capacitor sizes (10×10 mm and 0.8×0.8 mm) to determine the effect of hydrogen in the metalization processes for different types of SiN layers formed above the capacitors in the capacitor level (e.g., capacitor level SiN etch stop layer). In a first device (values 212a and 212b in the plot 210), the capacitor level SiN layer (e.g., relatively high silicon-hydrogen SiN) was formed using a conventional HDP deposition process, and in the second device (values 214a and 214b), a high silicon-hydrogen SiN capacitor level etch stop layer was formed using a conventional PECVD process. In the third device, the capacitor level etch stop layer was low silicon-hydrogen PECVD SiN (e.g., layer 112b in the device 102, formed according to the recipe I in Table 1 above) in accordance with the present invention. As can be seen in FIG. 6B, the low silicon-hydrogen SiN material of the present invention provides significantly better protection against hydrogen from the back-end metalization processing than do the conventional PECVD or HDP SiN materials and techniques.

Figure 7:
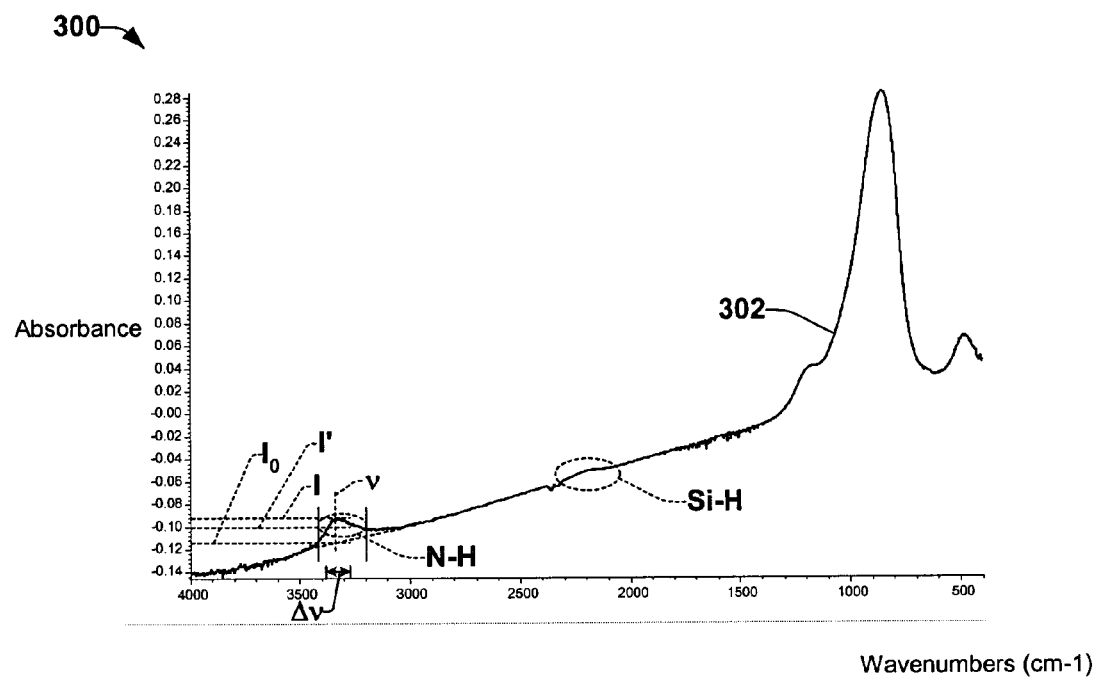
FIG. 7 is an exemplary Fourier Transform Infrared (FTIR) spectra plot illustrating infrared absorbance or absorption for a low silicon-hydrogen SiN layer in accordance with the invention.
Figure 8:
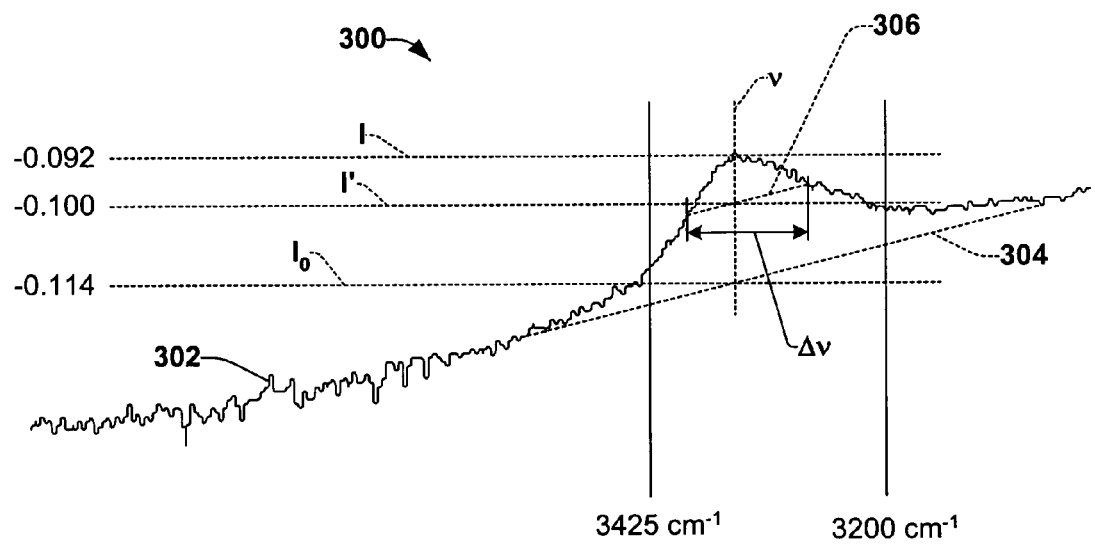
FIG. 8 is a portion of the exemplary FTIR plot of FIG. 7, illustrating one possible technique for determining a figure of merit for a low silicon-hydrogen SiN layer in accordance with the invention.
Figure 9A:
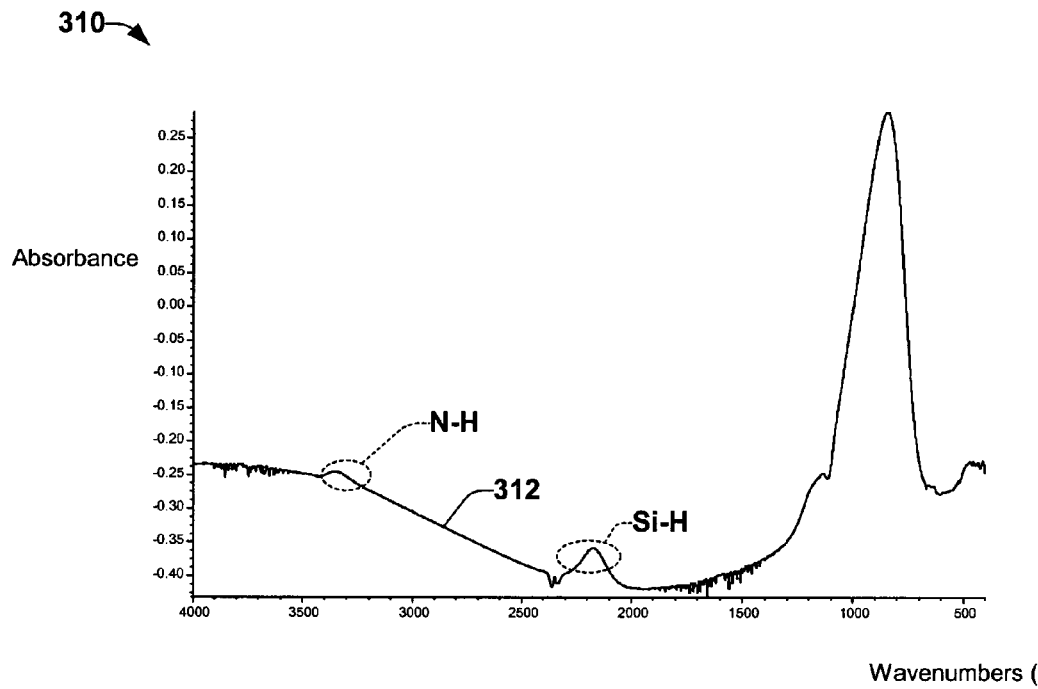
FIGS. 9A and 9B are FTIR spectra plots illustrating infrared absorbance for conventional high silicon-hydrogen SiN layers.
Figure 9B:
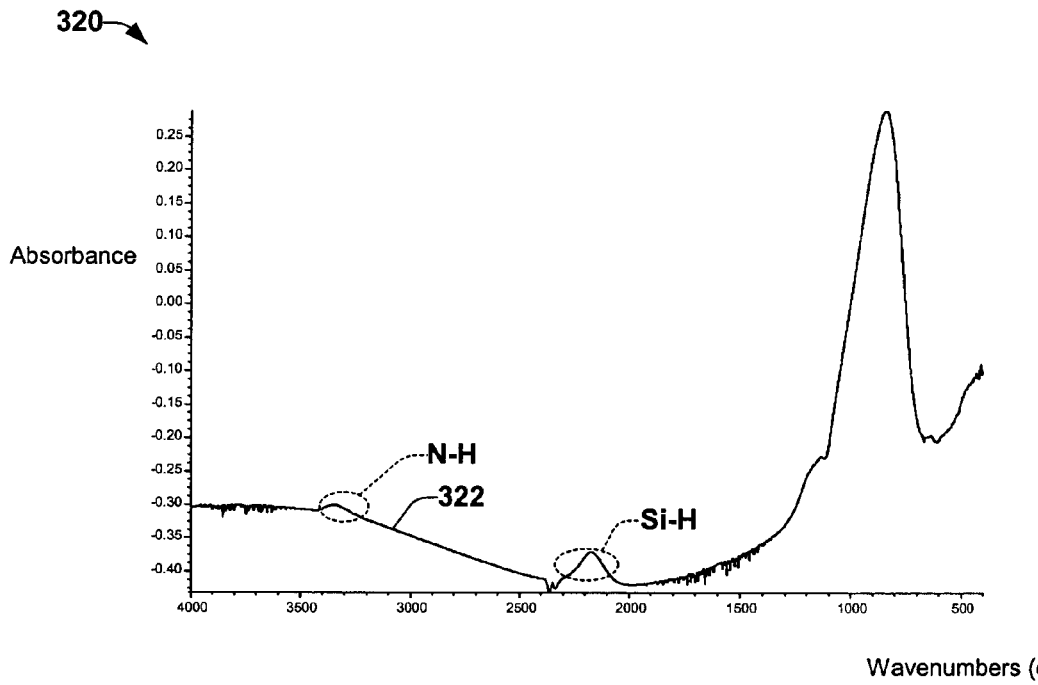

Referring now to FIGS. 7–9B, an exemplary FTIR plot 300 is illustrated in FIG. 7 showing an infrared absorbance or absorption spectra 302 for a low silicon-hydrogen SiN layer in accordance with the invention (e.g., layer 112 in the device 102 above). FIG. 8 further illustrates a portion of the plot 300 of FIG. 7, showing one possible technique for determining a figure of merit for a low silicon-hydrogen SiN layer in accordance with the invention. FIGS. 9A and 9B provide FTIR spectra plots 310 and 320 illustrating infrared absorbance for conventional high silicon-hydrogen SiN PECVD layers.

As used herein, the FTIR figure of merit for the low silicon-hydrogen SiN materials of the invention relates the relative amounts of silicon-hydrogen (Si—H) and nitrogen-hydrogen (N—H) in the deposited SiN. It is believed that the hydrogen content of the low silicon-hydrogen SiN materials of the invention has a lower tendency to dissociate than in conventional SiN materials in which the hydrogen content is largely bonded with silicon, because Si—H bonds are of lower bond energy (e.g., about 3.34 eV) than are N—H bonds (e.g., about 4.05 eV).

FTIR spectra may be used to provide a figure of merit (FOM) or value used in ascertaining the relative amounts of silicon-hydrogen (Si—H) and nitrogen-hydrogen (N—H) in a SiN material. FTIR spectroscopy is the study of the interaction of infrared (IR) radiation with a sample, such as a wafer with a deposited SiN layer, to measure the frequencies at which the sample absorbs such radiation, as well as the intensity of the absorption. This type of measurement allows identification of the chemical composition of the sample (e.g., of the deposited SiN material), because chemical functional groups, such as SiN, Si—H, N—H, etc., are known to absorb IR radiation at specific frequencies, wherein the intensity of the absorption at a certain frequency or frequency band is related to the concentration of the corresponding component. In typical FTIR spectra plots, such as the exemplary plot 300 in FIGS. 7 and 8, the frequency (X axis) is generally depicted in terms of wavenumbers in units of $cm^{-1}$.

For the exemplary low hydrogen-silicon SiN material corresponding to the plot 300 in FIGS. 7 and 8, a large peak is found, that is centered at around 900 $cm^{-1}$, corresponding to SiN. It is known that Si—H absorption will appear in the wavenumber range of 2050–2350 $cm^{-1}$, and that N—H absorption is found in the wavenumber range of 3200–3425 $cm^{-1}$, as shown by the circled portions of the absorption spectra 302. It is further assumed that Si—H bonds in SiN have about 1.4 times the specific absorption of N—H bonds, which is believed to be due to the corresponding difference in bond energies. The absorption intensity at these bands of interest can be quantified in terms of the area under the peaks, which may be computed or calculated using any suitable technique within the scope of the invention. The ratio of the areas for Si—H and N—H is then determined and divided by the scaling factor 1.4 (e.g., Si—H/1.4N—H) to obtain the figure of merit, wherein the low silicon-hydrogen SiN materials of the present invention have an FTIR figure of merit of about 0.05 or less, such as 0.04 or less in one example, and about 0.02 or less in another example.

One possible technique for obtaining the relevant area measurement from the FTIR spectra 302 is illustrated in FIG. 8, wherein a line 304 is drawn beneath the peak (e.g., local maxima) of interest (e.g., N—H in FIG. 8). The wavenumber (e.g., frequency) at which the peak occurs is identified as 'v', and the corresponding intensity value 'I' is identified (e.g., I=−0.092 in this example). A corresponding intensity value $I_0$ is determined as the intensity of the line 304 at the frequency v (e.g., $I_0$=−0.114 in this example). Using these intensity values, a third intensity I' is determined as the square root of the product I and $I_0$ (e.g., I' is the square root of ((−0.092)×(−0.114))=0.1024 in this example). A line 306 is then drawn parallel to the line 304, so as to intersect the frequency v and the intensity value I'. The frequency values at which this line 306 crosses the spectra 302 are subtracted to obtain a value Δv (e.g.,=about 110 $cm^{-1}$ in this example). The area corresponding to the N—H peak is then determined as 'A' times Δv, where A=$\log_{10}$ of $I_0$/I=0.0931, resulting in an area of about 10.243.

A similar technique can be employed to find the area under any peak for Si—H, and the ratio of the areas is divided by 1.4 (e.g., Si—H/1.4N—H) to obtain the FTIR figure of merit. As can be seen in the FTIR spectra 302 in FIGS. 7 and 8, most of the hydrogen in the low silicon-hydrogen SiN is involved in N—H bonds, whereby the hydrogen is less likely to dissociate during thermal processing of a semiconductor device wafer. In this manner, the low silicon-hydrogen SiN is less likely to act as a source of hydrogen to ferroelectric capacitors or transistors than are SiN films having high silicon-hydrogen content. Furthermore, the employment of PECVD deposition techniques using high $N_2$ flow and low ammonia flow for forming the low silicon-hydrogen SiN provides more conformal coverage, particularly along the lateral sidewalls of capacitor and transistor structures, thereby providing a better barrier against hydrogen diffusion than conventional HDP SiN deposition techniques. As seen in Table 1 above, the figure of merit for the exemplary low silicon-hydrogen SiN materials of the invention is about 0.05 or less. This is exemplified in the plot 300, wherein the spectra curve 302 is basically smooth in the Si—H band of wavenumbers 2050–2350, indicating little or no absorption. Consequently, the material has little or no Si—H, but relatively high amounts of N—H.

Referring also to FIGS. 9A and 9B, the inventors have found that conventional high silicon-hydrogen SiN materials using old PECVD deposition methods typically yield a corresponding FTIR figure of merit of about 0.8 or more. FIG. 9A illustrates a first plot 310 with an FTIR spectra 312 having a significant peak absorbance for the Si—H band at 2050–2350 cm$^{-1}$, and a relatively smaller peak absorbance for the N—H band at 3200–3425 cm$^{-1}$. The same is true in FIG. 9B, where a plot 320 is provided for an FTIR spectra 322. In this example, the spectra 322 similarly indicates a high absorbance for Si—H and relatively lower absorbance for N—H, wherein a large amount of hydrogen is contained in weaker Si—H bonds, therefore being more likely to dissociate at temperature, leading to ferroelectric PSW degradation and/or to NBTI problems for device transistors.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of fabricating a semiconductor device, comprising:
   forming a ferroelectric capacitor in a capacitor level above a semiconductor body; and
   forming a low silicon-hydrogen SiN layer above the ferroelectric capacitor, the low silicon-hydrogen SiN layer having an FTIR figure of merit value of about 0.05 or less, wherein the FTIR figure of merit is calculated as:

Si—H absorbance/(N—H absorbance×1.4).

2. The method of claim 1, wherein forming the low silicon-hydrogen SiN layer comprises depositing a low silicon-hydrogen SiN material above the ferroelectric capacitor using a plasma enhanced chemical vapor deposition process.

3. The method of claim 2, wherein depositing the low silicon-hydrogen SiN material comprises performing the plasma enhanced chemical vapor deposition process with an $N_2$ flow of about 10,000 sccm or more and an $NH_3$ flow of about 1,000 sccm or less.

4. The method of claim 3, wherein depositing the low silicon-hydrogen SiN material comprises performing the plasma enhanced chemical vapor deposition process with an $N_2$ flow of about 14,000 sccm or more.

5. The method of claim 4, wherein depositing the low silicon-hydrogen SiN material comprises performing the plasma enhanced chemical vapor deposition process with an $NH_3$ flow of about 750 sccm or less.

6. The method of claim 3, wherein depositing the low silicon-hydrogen SiN material comprises performing the plasma enhanced chemical vapor deposition process with an $NH_3$ flow of about 750 sccm or less.

7. The method of claim 2, wherein the low silicon-hydrogen SiN layer is one of an etch stop layer in the capacitor level, an etch stop layer in a metalization level above the capacitor level, and an etch stop layer in a protective oxide level above an uppermost metalization level.

8. The method of claim 7, further comprising forming a second low silicon-hydrogen SiN layer above a transistor in the semiconductor device, the second low silicon-hydrogen SiN layer being below the capacitor level, the second low silicon-hydrogen SiN layer having an FTIR figure of merit value of about 0.05 or less, wherein the FTIR figure of merit is calculated as:

Si—H absorbance/(N—H absorbance×1.4).

9. The method of claim 8, wherein the second low silicon-hydrogen SiN layer is an etch stop layer in a polymetal dielectric level.

10. The method of claim 2, wherein the low silicon-hydrogen SiN layer has an FTIR figure of merit value of about 0.04 or less.

11. The method of claim 2, wherein the low silicon-hydrogen SiN layer has an FTIR figure of merit value of about 0.03 or less.

12. The method of claim 1, wherein the low silicon-hydrogen SiN layer has an FTIR figure of merit value of about 0.04 or less.

13. The method of claim 12, wherein the low silicon-hydrogen SiN layer has an FTIR figure of merit value of about 0.03 or less.

14. The method of claim 1, wherein the low silicon-hydrogen SiN layer is one of an etch stop layer in the capacitor level, an etch stop layer in a metalization level above the capacitor level, and an etch stop layer in a protective oxide level above an uppermost metalization level.

15. The method of claim 14, wherein the low silicon-hydrogen SiN layer is an etch stop layer in the capacitor level.

16. The method of claim 14, wherein the low silicon-hydrogen SiN layer is an etch stop layer in a metalization level above the capacitor level.

17. The method of claim 14, wherein the low silicon-hydrogen SiN layer is an etch stop layer in a protective oxide level above an uppermost metalization level.

18. The method of claim 14, further comprising forming a second low silicon-hydrogen SiN layer above a transistor in the semiconductor device, the second low silicon-hydrogen SiN layer being below the capacitor level, the second low silicon-hydrogen SiN layer having an FTIR figure of merit value of about 0.05 or less, wherein the FTIR figure of merit is calculated as:

Si—H absorbance/(N—H absorbance×1.4).

19. The method of claim 18, wherein the second low silicon-hydrogen SiN layer is an etch stop layer in a poly-metal dielectric level.

20. The method of claim 1, further comprising forming a second low silicon-hydrogen SiN layer above a transistor in the semiconductor device, the second low silicon-hydrogen SiN layer being below the capacitor level, the second low silicon-hydrogen SiN layer having an FTIR figure of merit value of about 0.05 or less, wherein the FTIR figure of merit is calculated as:

Si—H absorbance/(N—H absorbance×1.4).

21. The method of claim 20, wherein the second low silicon-hydrogen SiN layer is an etch stop layer in a poly-metal dielectric level.

22. A method of fabricating a semiconductor device, comprising:
   forming a ferroelectric capacitor in a capacitor level above a semiconductor body; and
   forming a low silicon-hydrogen SiN layer above a transistor in the semiconductor device, the low silicon-hydrogen SiN layer being below the capacitor level, the low silicon-hydrogen SiN layer having an FTIR figure of merit value of about 0.05 or less, wherein the FTIR figure of merit is calculated as:

Si—H absorbance/(N—H absorbance×1.4).

23. The method of claim 22, further comprising forming a second low silicon-hydrogen SiN layer above the ferroelectric capacitor, the second low silicon-hydrogen SiN layer having an FTIR figure of merit value of about 0.05 or less, wherein the FTIR figure of merit is calculated as:

Si—H absorbance/(N—H absorbance×1.4).

24. The method of claim 22, wherein forming the low silicon-hydrogen SiN layer comprises depositing a low silicon-hydrogen SiN material above the transistor using a plasma enhanced chemical vapor deposition process.

25. The method of claim 24, wherein depositing the low silicon-hydrogen SiN material comprises performing the plasma enhanced chemical vapor deposition process with an $N_2$ flow of about 10,000 sccm or more and an $NH_3$ flow of about 1,000 sccm or less.

26. The method of claim 25, wherein depositing the low silicon-hydrogen SiN material comprises performing the plasma enhanced chemical vapor deposition process with an $N_2$ flow of about 14,000 sccm or more.

27. The method of claim 25, wherein depositing the low silicon-hydrogen SiN material comprises performing the plasma enhanced chemical vapor deposition process with an $NH_3$ flow of about 750 sccm or less.

28. The method of claim 22, wherein the low silicon-hydrogen SiN layer is an etch stop layer in a poly-metal dielectric level.

29. The method of claim 22, wherein the low silicon-hydrogen SiN layer has an FTIR figure of merit value of about 0.04 or less.

30. The method of claim 22, wherein the low silicon-hydrogen SiN layer has an FTIR figure of merit value of about 0.03 or less.

31. A semiconductor device, comprising:
   a ferroelectric capacitor formed in a capacitor level above a semiconductor body; and
   a hydrogen barrier above the ferroelectric capacitor, the hydrogen barrier comprising a low silicon-hydrogen SiN layer having an FTIR figure of merit value of about 0.05 or less, wherein the FTIR figure of merit is calculated as:

Si—H absorbance/(N—H absorbance×1.4).

32. The semiconductor device of claim 31, wherein the low silicon-hydrogen SiN layer is one of an etch stop layer in the capacitor level, an etch stop layer in a metalization level above the capacitor level, and an etch stop layer in a protective oxide level above an uppermost metalization level.

33. The semiconductor device of claim 32, further comprising a second low silicon-hydrogen SiN layer above a transistor in the semiconductor device, the second low silicon-hydrogen SiN layer being below the capacitor level, the second low silicon-hydrogen SiN layer having an FTIR figure of merit value of about 0.05 or less, wherein the FTIR figure of merit is calculated as:

Si—H absorbance/(N—H absorbance×1.4).

34. The semiconductor device of claim 33, wherein the second low silicon-hydrogen SiN layer is an etch stop layer in a poly-metal dielectric level.

35. The semiconductor device of claim 31, wherein the low silicon-hydrogen SiN layer has an FTIR figure of merit value of about 0.04 or less.

36. The semiconductor device of claim 31, wherein the low silicon-hydrogen SiN layer has an FTIR figure of merit value of about 0.03 or less.

37. A semiconductor device, comprising:
   a ferroelectric capacitor formed in a capacitor level above a semiconductor body; and
   a hydrogen barrier above a transistor and below the capacitor level in the semiconductor device, the hydrogen barrier comprising a low silicon-hydrogen SiN layer having an FTIR figure of merit value of about 0.05 or less, wherein the FTIR figure of merit is calculated as:

Si—H absorbance/(N—H absorbance×1.4).

38. The semiconductor device of claim 37, further comprising a second low silicon-hydrogen SiN layer above the ferroelectric capacitor, the second low silicon-hydrogen SiN layer having an FTIR figure of merit value of about 0.05 or less, wherein the FTIR figure of merit is calculated as:

Si—H absorbance/(N—H absorbance×1.4).

39. The semiconductor device of claim 37, wherein the low silicon-hydrogen SiN layer is an etch stop layer in a poly-metal dielectric level.

40. The semiconductor device of claim 37, wherein the low silicon-hydrogen SiN layer has an FTIR figure of merit value of about 0.04 or less.

41. The semiconductor device of claim 37, wherein the low silicon-hydrogen SiN layer has an FTIR figure of merit value of about 0.03 or less.

* * * * *